US012338531B2

(12) United States Patent
Shaikh et al.

(10) Patent No.: US 12,338,531 B2
(45) Date of Patent: *Jun. 24, 2025

(54) SPATIALLY TUNABLE DEPOSITION TO COMPENSATE WITHIN WAFER DIFFERENTIAL BOW

(71) Applicant: Lam Research Corporation, Fremont, CA (US)

(72) Inventors: Fayaz A. Shaikh, Lake Oswego, OR (US); Adriana Vintila, Wilsonville, OR (US); Matthew Mudrow, Tigard, OR (US); Nick Ray Linebarger, Jr., Tualatin, OR (US); Xin Yin, Beaverton, OR (US); James F. Lee, Casper, WY (US); Brian Joseph Williams, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/427,348

(22) Filed: Jan. 30, 2024

(65) Prior Publication Data

US 2024/0167161 A1 May 23, 2024

Related U.S. Application Data

(63) Continuation of application No. 17/633,942, filed as application No. PCT/US2020/045281 on Aug. 6, 2020, now Pat. No. 11,946,142.

(Continued)

(51) Int. Cl.
*C23C 16/455* (2006.01)
*C23C 16/04* (2006.01)
(Continued)

(52) U.S. Cl.
CPC ........ *C23C 16/4585* (2013.01); *C23C 16/042* (2013.01); *C23C 16/4409* (2013.01);
(Continued)

(58) Field of Classification Search
CPC .............. C23C 16/4585; C23C 16/042; C23C 16/4409; C23C 16/45521;
(Continued)

(56) References Cited

U.S. PATENT DOCUMENTS 4,892,753 A 1/1990 Wang et al.
4,951,603 A * 8/1990 Yoshino ............ C23C 16/45508
118/728

(Continued)

FOREIGN PATENT DOCUMENTS

CN 1739864 A 3/2006
CN 1830069 A 9/2006
(Continued)

OTHER PUBLICATIONS

CN Office Action dated Apr. 25, 2017 in CN Application No. 201510266980.4.

(Continued)

*Primary Examiner* — Rudy Zervigon
(74) *Attorney, Agent, or Firm* — Weaver Austin Villeneuve & Sampson LLP

(57) ABSTRACT

A plasma processing chamber for depositing a film on an underside surface of a wafer, includes a showerhead pedestal. The showerhead pedestal includes a first zone and a second zone. The first zone is configured for depositing a first film to the underside surface of the wafer and the second zone is configured for depositing a second film to the underside surface of the wafer.

20 Claims, 12 Drawing Sheets

Related U.S. Application Data

(60) Provisional application No. 62/888,401, filed on Aug. 16, 2019.

(51) Int. Cl.
  *C23C 16/44* (2006.01)
  *C23C 16/458* (2006.01)
  *C23C 16/509* (2006.01)

(52) U.S. Cl.
  CPC .. *C23C 16/45521* (2013.01); *C23C 16/45565* (2013.01); *C23C 16/45574* (2013.01); *C23C 16/45597* (2013.01); *C23C 16/509* (2013.01)

(58) Field of Classification Search
  CPC ........ C23C 16/45565; C23C 16/45574; C23C 16/45597; C23C 16/509; C23C 16/5096; C23C 16/54; C23C 16/507; H01J 37/3244; H01J 15/00; H01J 37/32091; H01J 37/32082; H01J 37/32623; H01J 37/32009; H01J 37/32532; H01L 21/67109; H01L 21/68735; H01L 21/68764; H01L 21/68771; H01L 21/68785; H01L 21/67069
  USPC .......... 118/723 E, 723 ER, 728; 156/345.43, 156/345.44, 345.45, 345.46, 345.47, 156/345.51, 345.52, 345.53, 345.54, 156/345.55
  See application file for complete search history.

(56) References Cited

U.S. PATENT DOCUMENTS

| | | | |
|---|---|---|---|
| 5,000,113 | A | 3/1991 | Wang et al. |
| 5,074,017 | A | 12/1991 | Toya et al. |
| 5,242,539 | A | 9/1993 | Kumihashi et al. |
| 5,338,363 | A | 8/1994 | Kawata et al. |
| 5,651,867 | A | 7/1997 | Kokaku et al. |
| 5,789,028 | A | 8/1998 | Zhao et al. |
| 5,792,269 | A | 8/1998 | Deacon et al. |
| 5,888,304 | A | 3/1999 | Umotoy et al. |
| 5,964,952 | A | 10/1999 | Kunze-Concewitz |
| 5,981,899 | A | 11/1999 | Perrin et al. |
| 6,017,396 | A | 1/2000 | Okamoto |
| 6,111,225 | A * | 8/2000 | Ohkase ............. H01L 21/67109 118/724 |
| 6,113,698 | A * | 9/2000 | Raaijmakers ..... H01L 21/67103 118/715 |
| 6,153,012 | A | 11/2000 | Rupp et al. |
| 6,170,496 | B1 * | 1/2001 | Chen ........................ B08B 5/02 134/22.12 |
| 6,179,924 | B1 | 1/2001 | Zhao et al. |
| 6,183,565 | B1 * | 2/2001 | Granneman ...... C23C 16/45597 118/724 |
| 6,245,192 | B1 | 6/2001 | Dhindsa et al. |
| 6,251,191 | B1 | 6/2001 | Matsuse |
| 6,279,506 | B1 | 8/2001 | Jurgensen et al. |
| 6,329,304 | B1 * | 12/2001 | Kuznetsov ........ H01L 21/67248 118/724 |
| 6,461,439 | B1 * | 10/2002 | Granneman .......... C23C 16/458 118/724 |
| 6,565,661 | B1 | 5/2003 | Nguyen |
| 6,613,685 | B1 | 9/2003 | Granneman et al. |
| 6,746,237 | B2 * | 6/2004 | Storm ............... H01L 21/67109 432/5 |
| 6,788,991 | B2 | 9/2004 | De Haas et al. |
| 6,800,187 | B1 | 10/2004 | Reid et al. |
| 6,805,749 | B2 | 10/2004 | Granneman et al. |
| 6,940,047 | B2 * | 9/2005 | van Kesteren .... H01L 21/67784 432/5 |
| 6,964,751 | B2 | 11/2005 | Storm et al. |
| 7,022,627 | B2 * | 4/2006 | Granneman ........ H01L 21/6838 438/795 |
| 7,033,444 | B1 | 4/2006 | Komino et al. |
| 7,153,772 | B2 * | 12/2006 | Granneman ...... H01L 21/28518 438/682 |
| 7,217,670 | B2 * | 5/2007 | van Kesteren .... H01L 21/67109 438/795 |
| 7,312,156 | B2 | 12/2007 | Granneman et al. |
| 7,410,355 | B2 * | 8/2008 | Granneman ...... H01L 21/67248 432/5 |
| 7,534,977 | B2 | 5/2009 | Yamazaki |
| 7,691,750 | B2 | 4/2010 | Granneman et al. |
| 7,754,013 | B2 | 7/2010 | Granneman |
| 7,858,898 | B2 | 12/2010 | Bailey, III et al. |
| 7,927,455 | B2 | 4/2011 | Kishimoto et al. |
| 7,943,007 | B2 | 5/2011 | Bailey, III et al. |
| 8,092,640 | B2 | 1/2012 | Kishimoto et al. |
| 8,101,531 | B1 | 1/2012 | Li et al. |
| 8,133,322 | B2 | 3/2012 | Nakamura et al. |
| 8,137,465 | B1 | 3/2012 | Shrinivasan et al. |
| 8,147,648 | B2 | 4/2012 | Dhindsa |
| 8,308,931 | B2 | 11/2012 | Reid et al. |
| 8,349,196 | B2 | 1/2013 | Fairbairn et al. |
| 8,373,086 | B2 * | 2/2013 | Kim .................. H01J 37/32009 156/345.47 |
| 8,562,750 | B2 | 10/2013 | Chen et al. |
| 8,580,078 | B2 | 11/2013 | Bailey, III et al. |
| 8,701,268 | B2 | 4/2014 | Larson et al. |
| 8,721,908 | B2 | 5/2014 | Bailey, III et al. |
| 8,728,956 | B2 | 5/2014 | Lavoie et al. |
| 8,784,622 | B2 | 7/2014 | Barnes et al. |
| 8,888,950 | B2 | 11/2014 | Lee et al. |
| 8,956,456 | B2 | 2/2015 | Vermeer et al. |
| 9,017,526 | B2 | 4/2015 | Singh et al. |
| 9,165,587 | B2 | 10/2015 | Barnes et al. |
| 9,175,391 | B2 | 11/2015 | Endo et al. |
| 9,238,867 | B2 * | 1/2016 | Granneman ...... H01L 21/67784 |
| 9,243,330 | B2 | 1/2016 | Granneman et al. |
| 9,245,761 | B2 | 1/2016 | Singh et al. |
| 9,273,392 | B2 | 3/2016 | Vermeer et al. |
| 9,328,416 | B2 | 5/2016 | Dhas et al. |
| 9,449,808 | B2 | 9/2016 | Buckalew et al. |
| 9,644,271 | B1 | 5/2017 | Keil et al. |
| 9,776,905 | B2 | 10/2017 | Maschmeyer et al. |
| 9,870,917 | B2 | 1/2018 | Kang et al. |
| 9,881,788 | B2 | 1/2018 | Kim et al. |
| 10,109,517 | B1 | 10/2018 | Blank et al. |
| 10,233,111 | B2 | 3/2019 | Lezzi et al. |
| 10,358,722 | B2 | 7/2019 | Wiltse et al. |
| 10,611,664 | B2 | 4/2020 | Lezzi et al. |
| 10,851,457 | B2 | 12/2020 | Shaikh et al. |
| 10,900,122 | B2 * | 1/2021 | Shugrue ............ C23C 16/45508 |
| 10,954,597 | B2 * | 3/2021 | de Ridder .......... H01L 21/0228 |
| 11,097,974 | B2 | 8/2021 | Lezzi et al. |
| 11,441,222 | B2 * | 9/2022 | Shaikh .............. C23C 16/45565 |
| 11,725,283 | B2 * | 8/2023 | Shaikh .............. H01L 21/02164 438/758 |
| 11,851,760 | B2 | 12/2023 | Shaikh et al. |
| 11,946,142 | B2 * | 4/2024 | Shaikh ................ C23C 16/4409 |
| 2001/0004479 | A1 | 6/2001 | Cheung et al. |
| 2002/0036343 | A1 * | 3/2002 | Moriya ............. H01L 21/67109 257/717 |
| 2002/0062792 | A1 | 5/2002 | Boydston et al. |
| 2003/0091870 | A1 | 5/2003 | Bhowmik et al. |
| 2003/0209323 | A1 * | 11/2003 | Yokogaki .......... C23C 16/45565 156/345.33 |
| 2004/0003777 | A1 | 1/2004 | Carpenter et al. |
| 2004/0005211 | A1 | 1/2004 | Lowrance et al. |
| 2004/0035358 | A1 | 2/2004 | Basceri et al. |
| 2004/0082251 | A1 | 4/2004 | Bach et al. |
| 2004/0087168 | A1 | 5/2004 | Granneman et al. |
| 2004/0134611 | A1 | 7/2004 | Kato et al. |
| 2004/0142558 | A1 * | 7/2004 | Granneman ............ C30B 25/14 118/715 |
| 2004/0190215 | A1 | 9/2004 | Weldon et al. |
| 2005/0022740 | A1 | 2/2005 | Hatano |
| 2005/0037619 | A1 | 2/2005 | Granneman et al. |
| 2005/0103267 | A1 | 5/2005 | Hur et al. |
| 2005/0109460 | A1 | 5/2005 | DeDontney et al. |
| 2005/0148139 | A1 | 7/2005 | Sashida |

(56) References Cited

U.S. PATENT DOCUMENTS

| | | |
|---|---|---|
| 2005/0183789 A1 | 8/2005 | Hong |
| 2005/0223982 A1 | 10/2005 | Park et al. |
| 2006/0110944 A1* | 5/2006 | Kesteren .......... H01L 21/67109 |
| | | 118/725 |
| 2006/0137609 A1 | 6/2006 | Puchacz et al. |
| 2006/0219362 A1 | 10/2006 | Han et al. |
| 2006/0264063 A1 | 11/2006 | Stern et al. |
| 2007/0015374 A1 | 1/2007 | Granneman |
| 2007/0034479 A1 | 2/2007 | Todaka |
| 2007/0095286 A1* | 5/2007 | Baek ................. C23C 16/45589 |
| | | 427/248.1 |
| 2007/0163996 A1 | 7/2007 | Horiguchi |
| 2007/0193688 A1 | 8/2007 | Dhindsa et al. |
| 2008/0026162 A1* | 1/2008 | Dickey ............. C23C 16/45551 |
| | | 427/595 |
| 2008/0066684 A1 | 3/2008 | Patalay et al. |
| 2008/0069951 A1 | 3/2008 | Chacin et al. |
| 2008/0073324 A1 | 3/2008 | Nogami et al. |
| 2008/0152838 A1 | 6/2008 | Sen et al. |
| 2008/0179010 A1 | 7/2008 | Bailey, III et al. |
| 2009/0000550 A1 | 1/2009 | Tran et al. |
| 2009/0008035 A1* | 1/2009 | Iwai ................. H01J 37/32082 |
| | | 156/345.47 |
| 2009/0011120 A1 | 1/2009 | Iwai |
| 2009/0071407 A1* | 3/2009 | Kuznetsov ............ C30B 35/002 |
| | | 118/728 |
| 2009/0095220 A1 | 4/2009 | Meinhold et al. |
| 2009/0096349 A1 | 4/2009 | Moshtagh et al. |
| 2009/0145752 A1 | 6/2009 | Barnes et al. |
| 2009/0145879 A1 | 6/2009 | Fairbairn et al. |
| 2009/0145881 A1 | 6/2009 | Barnes et al. |
| 2009/0241833 A1 | 10/2009 | Moshtagh et al. |
| 2009/0275210 A1* | 11/2009 | Shanker .................. C23C 16/46 |
| | | 438/761 |
| 2009/0291209 A1* | 11/2009 | Granneman ............ C30B 25/14 |
| | | 118/718 |
| 2009/0311869 A1 | 12/2009 | Okesaku et al. |
| 2010/0059478 A1* | 3/2010 | Lee ................... H01J 37/32431 |
| | | 156/345.33 |
| 2010/0116209 A1* | 5/2010 | Kato ....................... C23C 16/54 |
| | | 118/730 |
| 2010/0193915 A1 | 8/2010 | Kishimoto et al. |
| 2010/0270004 A1 | 10/2010 | Landess et al. |
| 2010/0314725 A1 | 12/2010 | Gu et al. |
| 2011/0024399 A1 | 2/2011 | Kim et al. |
| 2011/0034034 A1 | 2/2011 | Du Bois et al. |
| 2011/0049100 A1 | 3/2011 | Han et al. |
| 2011/0100955 A1 | 5/2011 | Pushparaj et al. |
| 2011/0212625 A1* | 9/2011 | Toyoda ............... C23C 16/4585 |
| | | 438/758 |
| 2011/0232571 A1 | 9/2011 | Hiura et al. |
| 2011/0244690 A1* | 10/2011 | Shanker ............. C23C 16/45565 |
| | | 257/E21.249 |
| 2011/0268879 A1* | 11/2011 | Granneman ....... H01L 21/67784 |
| | | 118/728 |
| 2011/0308551 A1 | 12/2011 | Chung et al. |
| 2012/0090992 A1 | 4/2012 | Fairbairn et al. |
| 2012/0097641 A1 | 4/2012 | Beckmann et al. |
| 2012/0108066 A1 | 5/2012 | New et al. |
| 2012/0196050 A1 | 8/2012 | Vermeer et al. |
| 2012/0222815 A1 | 9/2012 | Sabri et al. |
| 2012/0301616 A1 | 11/2012 | Endo et al. |
| 2013/0098761 A1 | 4/2013 | Fairbairn et al. |
| 2013/0183834 A1 | 7/2013 | Rogers et al. |
| 2013/0199448 A1* | 8/2013 | Granneman ...... C23C 16/45551 |
| | | 118/729 |
| 2013/0228284 A1 | 9/2013 | Denpoh et al. |
| 2014/0021673 A1 | 1/2014 | Chen et al. |
| 2014/0030445 A1 | 1/2014 | Vermeer et al. |
| 2014/0037847 A1* | 2/2014 | Vermeer ........... H01L 21/67784 |
| | | 427/255.28 |
| 2014/0038418 A1 | 2/2014 | Bailey, III et al. |
| 2014/0044887 A1* | 2/2014 | Vermeer ............. C23C 16/45551 |
| | | 427/535 |
| 2014/0199788 A1* | 7/2014 | Vermont ........... H01L 21/67784 |
| | | 118/712 |
| 2014/0252134 A1 | 9/2014 | Chen et al. |
| 2014/0273409 A1 | 9/2014 | Pitney et al. |
| 2014/0302681 A1 | 10/2014 | Paterson et al. |
| 2015/0167167 A1 | 6/2015 | Vermeer et al. |
| 2015/0228461 A1 | 8/2015 | Fukazawa et al. |
| 2015/0340225 A1* | 11/2015 | Kim .................. H01L 21/02301 |
| | | 118/728 |
| 2016/0172165 A1 | 6/2016 | Jeon et al. |
| 2016/0177444 A1 | 6/2016 | Baldasseroni et al. |
| 2016/0289827 A1 | 10/2016 | Augustyniak et al. |
| 2016/0319422 A1 | 11/2016 | Kurita et al. |
| 2016/0340782 A1 | 11/2016 | Chandrasekharan et al. |
| 2016/0362788 A1 | 12/2016 | Kurita et al. |
| 2017/0256393 A1 | 9/2017 | Kim et al. |
| 2017/0275756 A1 | 9/2017 | Blaquiere et al. |
| 2017/0345617 A1 | 11/2017 | Takeda |
| 2018/0334746 A1 | 11/2018 | Breiling et al. |
| 2019/0062918 A1* | 2/2019 | Shaikh .................. C23C 16/505 |
| 2019/0078211 A1* | 3/2019 | Kuenle ............... C23C 16/4584 |
| 2019/0131145 A1 | 5/2019 | Tai et al. |
| 2019/0145001 A1* | 5/2019 | Park .................... C23C 16/4585 |
| | | 118/723 R |
| 2019/0148211 A1* | 5/2019 | Seo ..................... C23C 16/4583 |
| | | 118/728 |
| 2020/0020563 A1 | 1/2020 | Nishida et al. |
| 2020/0321193 A1 | 10/2020 | Ni et al. |
| 2021/0079522 A1 | 3/2021 | Wu et al. |
| 2021/0108314 A1 | 4/2021 | Shaikh et al. |
| 2021/0166940 A1 | 6/2021 | Nozawa |
| 2021/0187521 A1 | 6/2021 | Mustafa et al. |
| 2021/0214846 A1 | 7/2021 | Nandwana et al. |
| 2021/0265134 A1 | 8/2021 | Singh et al. |
| 2021/0301402 A1* | 9/2021 | Suzuki ............. C23C 16/45544 |
| 2021/0404064 A1 | 12/2021 | Dip |
| 2021/0407843 A1 | 12/2021 | Yang et al. |
| 2022/0136107 A1 | 5/2022 | Lee et al. |
| 2022/0162753 A1 | 5/2022 | Shaikh et al. |
| 2022/0162754 A1 | 5/2022 | Shaikh et al. |
| 2022/0162755 A1 | 5/2022 | Shaikh et al. |
| 2022/0298632 A1* | 9/2022 | Shaikh .................. C23C 16/042 |
| 2023/0010049 A1* | 1/2023 | Vellanki ............ H01L 21/68757 |
| 2023/0238223 A1* | 7/2023 | Linebarger, Jr. .. H01J 37/32183 |
| | | 118/723 I |
| 2023/0352279 A1 | 11/2023 | Linebarger, Jr. et al. |
| 2024/0309507 A1 | 9/2024 | Shaikh et al. |

FOREIGN PATENT DOCUMENTS

| | | |
|---|---|---|
| CN | 1842240 A | 10/2006 |
| CN | 101116167 A | 1/2008 |
| CN | 101358337 A | 2/2009 |
| CN | 101389415 A | 3/2009 |
| CN | 101463473 A | 6/2009 |
| CN | 101589456 A | 11/2009 |
| CN | 101901752 A | 12/2010 |
| CN | 101919041 A | 12/2010 |
| CN | 102017083 A | 4/2011 |
| CN | 102232243 A | 11/2011 |
| CN | 102498558 A | 6/2012 |
| CN | 102575348 A | 7/2012 |
| CN | 103597113 A | 2/2014 |
| CN | 103628045 A | 3/2014 |
| CN | 103904155 A | 7/2014 |
| CN | 104233232 A | 12/2014 |
| CN | 104282530 A | 1/2015 |
| CN | 104685095 A | 6/2015 |
| CN | 104835712 A | 8/2015 |
| CN | 105088177 A | 11/2015 |
| CN | 105185727 A | 12/2015 |
| CN | 105420685 A | 3/2016 |
| CN | 105428194 A | 3/2016 |
| CN | 105719989 A | 6/2016 |
| CN | 106463344 A | 2/2017 |
| CN | 106463453 A | 2/2017 |
| CN | 106947958 A | 7/2017 |
| CN | 107393800 A | 11/2017 |

(56) References Cited

FOREIGN PATENT DOCUMENTS

| | | |
|---|---|---|
| CN | 109273378 A | 1/2019 |
| CN | 109797376 A | 5/2019 |
| CN | 215815786 U | 2/2022 |
| EP | 0550058 A2 | 7/1993 |
| EP | 1126047 A1 | 8/2001 |
| JP | H0478130 A | 3/1992 |
| JP | H0645266 A | 2/1994 |
| JP | 2002208590 A | 7/2002 |
| JP | 2003027242 A | 1/2003 |
| JP | 2003115483 A | 4/2003 |
| JP | 2007242858 A | 9/2007 |
| JP | 2009088473 A | 4/2009 |
| JP | 2011119472 A | 6/2011 |
| JP | 2012089661 A | 5/2012 |
| JP | 2012256895 A | 12/2012 |
| JP | 2013021112 A | 1/2013 |
| JP | 2013232670 A | 11/2013 |
| JP | 2016219803 A | 12/2016 |
| JP | 2018022685 A | 2/2018 |
| KR | 20000070265 A | 11/2000 |
| KR | 20020016706 A | 3/2002 |
| KR | 100335282 B1 | 7/2002 |
| KR | 20030083132 A | 10/2003 |
| KR | 20050084807 A | 8/2005 |
| KR | 20080018359 A | 2/2008 |
| KR | 20080048243 A | 6/2008 |
| KR | 20080084323 A | 9/2008 |
| KR | 20080092766 A | 10/2008 |
| KR | 20080100370 A | 11/2008 |
| KR | 20090053331 A | 5/2009 |
| KR | 20090106730 A | 10/2009 |
| KR | 20090118676 A | 11/2009 |
| KR | 20100122873 A | 11/2010 |
| KR | 20110095908 A | 8/2011 |
| KR | 20120105245 A | 9/2012 |
| KR | 20140011364 A | 1/2014 |
| KR | 20140067983 A | 6/2014 |
| KR | 101423358 B1 | 7/2014 |
| KR | 20150010669 A | 1/2015 |
| KR | 20150090538 A | 8/2015 |
| KR | 20150101785 A | 9/2015 |
| KR | 101562192 B1 | 10/2015 |
| KR | 101580511 B1 | 12/2015 |
| KR | 20150139774 A | 12/2015 |
| KR | 20160072056 A | 6/2016 |
| KR | 20160075351 A | 6/2016 |
| KR | 20160117261 A | 10/2016 |
| KR | 20180087153 A | 8/2018 |
| KR | 20190056021 A | 5/2019 |
| KR | 20190056030 A | 5/2019 |
| KR | 20200060579 A | 6/2020 |
| KR | 20200133493 A | 11/2020 |
| KR | 102185623 B1 | 12/2020 |
| KR | 20210073235 A | 6/2021 |
| KR | 20230069200 A | 5/2023 |
| TW | 200715403 A | 4/2007 |
| TW | 200837875 A | 9/2008 |
| TW | 200908136 A | 2/2009 |
| TW | 200913108 A | 3/2009 |
| TW | 200930826 A | 7/2009 |
| TW | 201335997 A | 9/2013 |
| TW | 201539617 A | 10/2015 |
| TW | 201542860 A | 11/2015 |
| TW | 201701318 A | 1/2017 |
| WO | WO-9801890 A1 | 1/1998 |
| WO | WO-2007023535 A1 | 3/2007 |
| WO | WO-2012151830 A1 | 11/2012 |
| WO | WO-2014030973 A1 | 2/2014 |
| WO | WO-2019046134 A1 | 3/2019 |
| WO | WO-2019055366 A1 | 3/2019 |
| WO | WO-2020031778 A1 | 2/2020 |
| WO | WO-2022060615 A1 | 3/2022 |
| WO | WO-2022119732 A1 | 6/2022 |

OTHER PUBLICATIONS

CN Office Action dated Dec. 1, 2023 in CN Application No. 202080058049.6 with English Translation.
CN Office Action dated Dec. 20, 2021, in CN Application No. 201880055786.3 with English translation.
CN Office Action dated Feb. 1, 2023 in Application No. CN202080012187 with English translation.
CN Office Action dated Jan. 11, 2024 in CN Application No. 202080012187, with English Translation.
CN Office Action dated Jan. 4, 2018 in CN Application No. 201510266980.4.
CN Office Action dated Sep. 28, 2023, in application No. CN202080012187.0 with English translation.
EP Extended Search Report dated Jun. 18, 2021 in EP Application No. 18852315.3.
International Preliminary Report on Patentability dated Mar. 3, 2022, in PCT Application No. PCT/US2020/045281.
International Search Report and Written Opinion dated Nov. 13, 2020 in PCT Application No. PCT/US2020/045281.
International Preliminary Report on Patentability and Written Opinion dated Aug. 12, 2021 in PCT Application No. PCT/US2020/013714.
International Preliminary Report on Patentability dated Jan. 5, 2023 in PCT Application No. PCT/US2021/038215.
International Preliminary Report on Patentability dated Jul. 23, 2020 in PCT Application PCT/US2018/048029.
International Search Report and Written Opinion dated Aug. 30, 2023, in Application No. PCT/US2023/021934.
International Search Report and Written Opinion dated Dec. 11, 2018 (ISA/KR) in PCT Application PCT/US2018/048029.
International Search Report and Written Opinion dated May 15, 2020 in PCT Application No. PCT/US2020/013714.
International Search Report and Written Opinion dated May 16, 2023 in PCT Application No. PCT/US2023/011056.
International Search Report and Written Opinion dated Oct. 22, 2021, in PCT Application No. PCT/US2021/038215.
International Search Report and Written Opinion dated Sep. 20, 2023 in PCT Application No. PCT/US2023/021927.
JP Office Action dated Oct. 4, 2022 in Application No. JP20200511239 with English translation.
KR Office Action dated Jun. 17, 2022, in Application No. KR10-2020-7009256 With English Translation.
KR Office Action dated Jun. 26, 2022 in Application No. KR10-2021-7041758 With English Translation.
KR Office Action dated Jun. 26, 2022 in Application No. KR10-2021-7041761 With English Translation.
KR Office Action dated Oct. 26, 2022 in Application No. KR10-2020-7009256 with English translation.
KR Office Action dated Oct. 26, 2022 in Application No. KR10-2021-7041758 with English translation.
KR Notice of Preliminary Examination Report dated Jun. 12, 2023, in Application No. KR10-2023-7013677 with English translation.
KR Office Action dated Oct. 27, 2022 in Application No. KR10-2021-7041761 With English Translation.
KR Office Action dated Aug. 18, 2023, in application No. KR 10-2023-7013677 with English translation.
KR Office Action dated Aug. 22, 2022 in Application No. KR10-2022-0088448 with English translation.
KR Office Action dated Dec. 12, 2023 in KR Application No. 10-2023-7037869 with English translation.
KR Office Action dated Dec. 18, 2023, in application No. 10-2023-7022595 with English translation.
KR Office Action dated Dec. 23, 2022 in Application No. KR10-2022-0088448 with English translation.
KR Office Action dated Dec. 27, 2023 in KR Application No. KR 10-2023-7013677 with English translation.
KR Office Action dated Feb. 4, 2024 in KR Application No. 10-2023-7037869 with English translation.
KR Office Action dated Feb. 18, 2022, in KR Application No. 1020207009256 with English Translation.
KR Office Action dated Feb. 21, 2022, in KR Application No. 10-2021-7041758 with English Translation.

(56) References Cited

OTHER PUBLICATIONS

KR Office Action dated Feb. 21, 2022, in KR Application No. 10-2021-7041761 with English translation.
KR Office Action dated Jul. 4, 2022 in Application No. KR10-2022-7008634 With English Translation.
KR Office Action dated Jun. 19, 2023, in application No. KR 10-2022-0088448 with English translation.
KR Office Action dated Jun. 21, 2021 in KR Application No. 10-2022-0035739.
KR Office Action dated Jun. 28, 2022, in Application No. KR10-2022-0035739 with English translation.
KR Office Action dated Nov. 25, 2022 in Application No. KR10-2022-7008634 With English Translation.
KR Office Action dated Oct. 25, 2022, in Application No. KR10-2022-0035739 with English translation.
KR Office Action dated Oct. 27, 2022 in Application No. KR 10-2022-7020424 with English Translation.
KR Prior Art Search Report dated Nov. 9, 2023, in Application No. KR10-2023-7037869 with English translation.
KR Prior Art Search Report dated Nov. 14, 2023, in Application No. KR10-2023-7038352 with English translation.
KR Search Report dated Jul. 27, 2022 in Application No. KR10-2022-0088448 with English translation.
KR Search Report dated May 10, 2023, in Application No. KR10-2023-7013677 with English translation.
KR Search Report dated Oct. 13, 2023, in Application No. KR 10-2023-7022595 with English translation.
TW Office Action dated Dec. 5, 2023 in TW Application No. 109102175, with English Translation.
TW Search Report & Grant Decision dated Nov. 30, 2018 in TW Application No. 104115987.
TW Search Report & Grant Decision dated Dec. 28, 2021, in TW Application No. 107130221 with English translation.
U.S Advisory Action dated Sep. 23, 2022 in U.S. Appl. No. 17/644,760.
U.S. Corrected Notice of Allowance dated Aug. 10, 2022 in U.S. Appl. No. 17/644,759.
U.S. Final office Action dated Aug. 22, 2022 in U.S. Appl. No. 17/644,760.
U.S. Advisory Action dated Mar. 18, 2024 in U.S. Appl. No. 17/080,749.
U.S. Advisory Action dated Sep. 28, 2022, in U.S. Appl. No. 17/644,761.
U.S. Appl. No. 15/846,100, inventors Kim et al., filed Dec. 18, 2017.
U.S. Corrected Notice of Allowance dated Oct. 26, 2022 in U.S. Appl. No. 17/644,761.
U.S. Corrected Notice of Allowance dated Nov. 17, 2023 in U.S. Appl. No. 17/644,760.
U.S. Final office Action dated Jul. 5, 2022 in U.S. Appl. No. 17/644,761.
US Final Office Action dated Jan. 15, 2020 in U.S. Appl. No. 15/692,300.
U.S. Final Office Action dated Jun. 27, 2017 in U.S. Appl. No. 14/285,544.
U.S. Final Office Action dated Nov. 21, 2023 in U.S. Appl. No. 17/080,749.
U.S. Final Office Action dated Sep. 21, 2016 in U.S. Appl. No. 14/285,544.
U.S. Non-Final Office Action dated Apr. 22, 2016 in U.S. Appl. No. 14/285,544.
U.S. Non-Final Office Action dated Dec. 23, 2016 in U.S. Appl. No. 14/285,544.
U.S. Non-Final Office Action dated May 5, 2022 in U.S. Appl. No. 17/644,760.
U.S. Non-Final Office Action dated May 24, 2023 in U.S. Appl. No. 17/080,749.
U.S. Non-Final Office Action dated Nov. 24, 2023 in U.S. Appl. No. 17/424,449.
U.S. Non-Final Office Action dated Oct. 27, 2015 in U.S. Appl. No. 14/285,544.
US Notice of Allowance (corrected) dated Sep. 18, 2020 in U.S. Appl. No. 15/692,300.
U.S. Notice of Allowance dated Apr. 5, 2023 in U.S. Appl. No. 17/644,760.
U.S. Notice of Allowance dated Apr. 25, 2023 in Application No. 17/644,761.
U.S. Notice of Allowance dated Aug. 24, 2023 in U.S. Appl. No. 17/644,760.
US Notice of Allowance dated Aug. 4, 2020 in U.S. Appl. No. 15/692,300.
U.S. Notice of Allowance dated Jul. 14, 2023 in U.S. Appl. No. 17/644,761.
U.S. Notice of Allowance dated Mar. 5, 2024 in U.S. Appl. No. 17/633,942.
U.S. Notice of Allowance dated May 3, 2022 in U.S. Appl. No. 17/644,759.
U.S. Notice of Allowance dated May 3, 2023 in U.S. Appl. No. 17/644,761.
U.S. Notice of Allowance dated Oct. 17, 2022 in U.S. Appl. No. 17/644,760.
U.S. Notice of Allowance dated Oct. 18, 2022 in U.S. Appl. No. 17/644,761.
U.S. Notice of Allowance dated Oct. 30, 2023, in U.S. Appl. No. 17/633,942.
U.S. Notice of Allowance dated Sep. 12, 2023 in U.S. Appl. No. 17/644,760.
U.S. Notice of Allowance dated Sep. 21, 2017 in U.S. Appl. No. 14/285,544.
US Office Action dated Apr. 14, 2022 in U.S. Appl. No. 17/644,760.
US Office Action dated Mar. 10, 2022 in U.S. Appl. No. 17/644,761.
US Office Action dated Mar. 26, 2020 in U.S. Appl. No. 15/692,300.
US Office Action dated Sep. 12, 2019 in U.S. Appl. No. 15/692,300.
U.S. Appl. No. 18/612,809, inventors Shaikh F, et al., filed Mar. 21, 2024.
U.S. Restriction requirement dated May 11, 2015 in U.S. Appl. No. 14/285,544.
CN Notice of Allowances dated Aug. 22, 2024 in CN Application No. 202210991402.7 with English translation.
CN Notice of Allowances dated Jul. 18, 2024 in CN Application No. 202080012187 with English translation.
CN Office Action dated Apr. 9, 2024 in CN Application No. 202210991402.7, with English translation.
CN Office Action dated Aug. 1, 2024 in CN Application No. 202080058049.6 with English translation.
CN Office Action dated Nov. 12, 2024 in CN Application No. 202080058049.6 with English translation.
International Preliminary Report on Patentability and Written Opinion dated Aug. 2, 2024 in PCT Application No. PCT/US2023/011056.
International Search Report and Written Opinion dated Dec. 3, 2024 in PCT Application No. PCT/US2024/042531.
JP Notice of Allowance dated Dec. 24, 2024 in JP Application No. 2022-579932 with English translation.
KR Office Action dated Dec. 26, 2024 in KR Application No. 10-2023-7022595, with English translation.
KR Office Action dated Jul. 10, 2024 in KR Application No. 10-2023-7038352 with English translation.
KR Office Action dated Jul. 29, 2024 in KR Application No. 10-2023-7003165, with English translation.
KR Office Action dated Jul. 29, 2024 in KR Application No. 10-2023-7022595, with English translation.
KR Office Action dated Jun. 12, 2024 in KR Application No. 10-2023-7001699 with English translation.
KR Office Action dated May 28, 2024 in KR Application No. 10-2023-7013677, with English translation.
KR Office Action dated Nov. 23, 2024 in KR Application No. 10-2021-7027749 with English translation.
TW Notice of Allowance and Search Report dated Nov. 26, 2024 in TW Application No. 113100849, with English translation.
U.S. Final Office Action dated Jun. 14, 2024 in U.S. Appl. No. 17/424,449.
U.S. Non-Final Office Action dated Jan. 30, 2025 in U.S. Appl. No. 17/424,449.

(56) References Cited

OTHER PUBLICATIONS

U.S. Appl. No. 18/730,257, inventors Linebarger, Jr., N.R, et al., filed Jul. 18, 2024.

* cited by examiner

Cross-section A-A from Fig. 4A (Cross-sectional view along upper and lower separator fins of ShoPed)

(Cross-section C-C from FIG. 4H)

(Cross-section D-D from FIG. 4H)

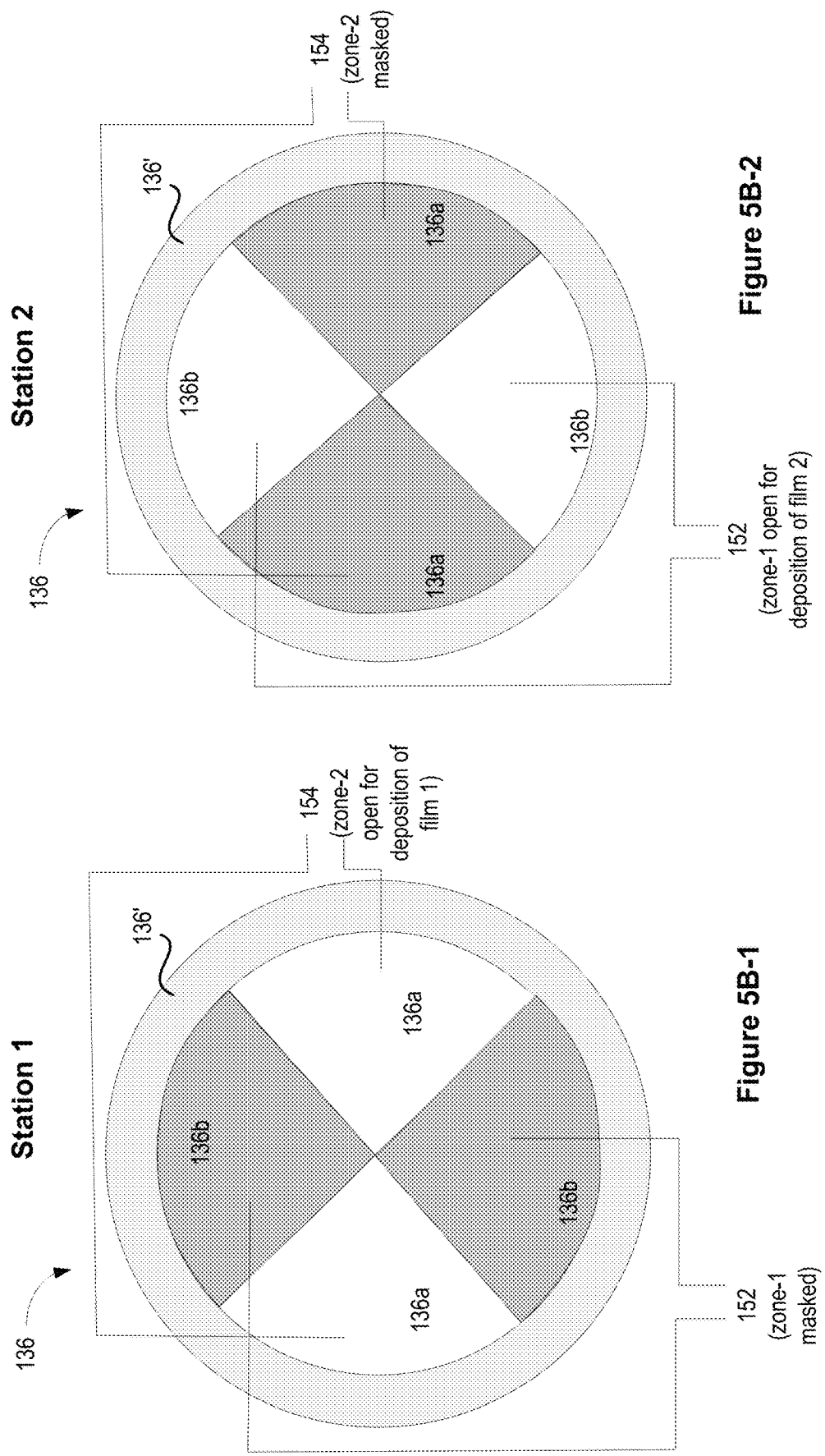

SPATIALLY TUNABLE DEPOSITION TO COMPENSATE WITHIN WAFER DIFFERENTIAL BOW

RELATED APPLICATION(S)

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD OF THE INVENTION

The present embodiments relate to semiconductor wafer processing equipment tools, and more particularly, to chambers having showerheads to perform back-side deposition to counteract wafer bowing caused by layers formed on a top-side.

BACKGROUND

Various thin film layers are deposited onto a top surface of a wafer (i.e., substrate) to form semiconductor devices. These thin film layers may be formed using known deposition processes, such as chemical vapor deposition (CVD) or plasma-enhanced chemical vapor deposition (PECVD). CVD is a type of deposition in which the wafer (i.e., substrate) is exposed to one or more volatile precursors. These volatile precursors react and/or decompose on the surface of the substrate to form thin films. PECVD is a type of chemical vapor deposition that is used to deposit thin films from a gas state (i.e., vapor) to a solid state on a substrate. In PECVD, a liquid precursor is converted into a vapor precursor, which is then delivered to a chamber. PECVD systems may include a vaporizer that vaporizes the liquid precursor in a controlled manner to generate the vapor precursor.

Typically, most deposition and other processing to form the semiconductor devices occur on a top surface (i.e., front face) of a substrate. As thin film layers are formed, they can introduce internal stress in the substrate. The internal stress is due to differences in chemical properties of the process gases used in forming the thin film layers. As more layers of thin films are deposited, the internal stress builds up. The built up internal stress and mismatch in the coefficient of thermal expansion (CTE) of the different thin films deposited on the substrate can cause the substrate to warp (i.e., bow). The substrate bowing is widely perceived as being convex or concave in shape. However, in certain cases the warp can be a saddle shape. This bowing is undesirable as it can make subsequent substrate processing more difficult.

Stress compensation is needed, in order to alleviate the undesirable effect of the bowing. One way of compensating for stress and to alleviate the undesirable effect of bowing is to deposit film layers on the back-side of the substrate to counteract the bowing induced by the film layers on the front side (i.e., top side) and the internal stress in the substrate caused by the different thin films. Depositing film layers on the back-side would require the substrate to be flipped and loaded with its back-side up. Flipping the wafer introduces additional problems, such as additional handling, potential exposure to particles, and/or reduction in processing yield.

Conventional technology used edge shadow rings for masking the edge in order to prevent exposure to particles. These edge shadow rings are static in nature and are unable to change. Further, these edge shadow rings target only the edge region and do not affect the substrate beyond the outer edge region. Other conventional technology used is standard patterning. However, the standard patterning process is very time intensive and requires many operations.

It is in this context that inventions arise.

SUMMARY

Embodiments of the disclosure provide systems and methods that enable deposition of thin films on an underside (i.e., backside) surface of a substrate to counteract substrate warping caused by deposition of thin films on the topside surface of the substrate. The systems and method disclosed herein include a lower electrode showerhead (or simply referred to herein as a "lower showerhead" or a "shower pedestal" or "ShoPed") with a plurality of zones, disposed in a bottom portion of a processing chamber. The ShoPed includes masking feature to define the different zones. Each of the different zones is connected to a separate gas source and interfaces with a distinct set of outlets defined on a top surface of the ShoPed. Process gases provided through distinct sets of outlets are used to generate different plasmas for depositing thin films in different sectors defined on an underside surface of the wafer, wherein the different sectors correspond with specific areas covered by the set of outlets of the respective zones. In an alternate embodiment, a masking plate with precise, determined shape and coverage area is disposed on a top surface of the ShoPed. The ShoPed on which the masking plate is disposed may be a zonal showerhead or a regular showerhead. The masking plate allows deposition of different thin films in defined patterns covering the different sectors defined on the underside surface of the substrate.

The use of the masking plate and/or the zonal lower showerhead allows for deposition of different films in specific pre-defined areas (i.e., specific sectors) on the underside surface of the wafer. The process gases for depositing thin films on the underside surface of the substrate are selected based on their tensile or compressive properties. The combination of the thickness of the films, properties of the gases used in forming the thin films, such as stress, tensile or compressive properties, as well as the sequence of application of the different thin films in the different sectors assist in the modulation of the stress on the back of the substrate so as to compensate for the substrate deformation (i.e., bowing) experienced from deposition of thin films on a top surface of the substrate. The modulation of the stress assists in improving device yield.

In one embodiment, a showerhead pedestal (ShoPed) for use in a plasma processing chamber for depositing films on an underside surface of a wafer, is disclosed. The ShoPed includes a first zone and a second zone. An upper separator fin is disposed over a top surface of the ShoPed and a lower separator fin is disposed under the top surface of the ShoPed and aligned with the upper separator fin. The first zone is configured for depositing a first film to the underside surface of the wafer and the second zone is configured for depositing a second film to the underside surface of the wafer.

In another embodiment, a showerhead pedestal (ShoPed) for use in a plasma processing chamber for depositing films on an underside surface of a wafer, is disclosed. The ShoPed includes an inner plenum defined within to receive a volume of process gas. A set of outlets is defined on a top surface of the ShoPed and is configured to interface with the inner plenum to provide the process gas for depositing a film. A masking plate is disposed over the top surface of the ShoPed. The masking plate includes a first area that includes opening and a second area that is masked. The first area of the masking plate is configured to provide the process gas to a portion of the underside surface of the wafer for depositing the film.

Other aspects of the invention will become apparent from the following detailed description, taken in conjunction with the accompanying drawings, illustrating by way of example the principles of the invention.

BRIEF DESCRIPTION OF THE DRAWINGS

FIG. 4G-1 illustrates a perspective view of inner plenums formed within the different zones of the showerhead pedestal, in accordance with one embodiment.

FIG. 4G-2 illustrates a simplified schematic representation of the inner plenums with corresponding process gas feeds, in accordance with one embodiment.

FIG. 4G-3 illustrates a schematic representation of the first inner plenum defined in the first zone along with the first gas feed that supplies the first process gas to the first inner plenum, in accordance with one embodiment.

FIG. 4G-4 illustrates a schematic representation of the second inner plenum defined in the second zone along with the second gas feed that supplies the second process gas to the second inner plenum, in accordance with one embodiment.

FIGS. 5B-1 and 5B-2 illustrate overhead views of a masking plate with different areas that are selectively activated or masked when used in two different stations to allow selective deposition of films, in accordance with one embodiment.

DESCRIPTION

Figure 1:
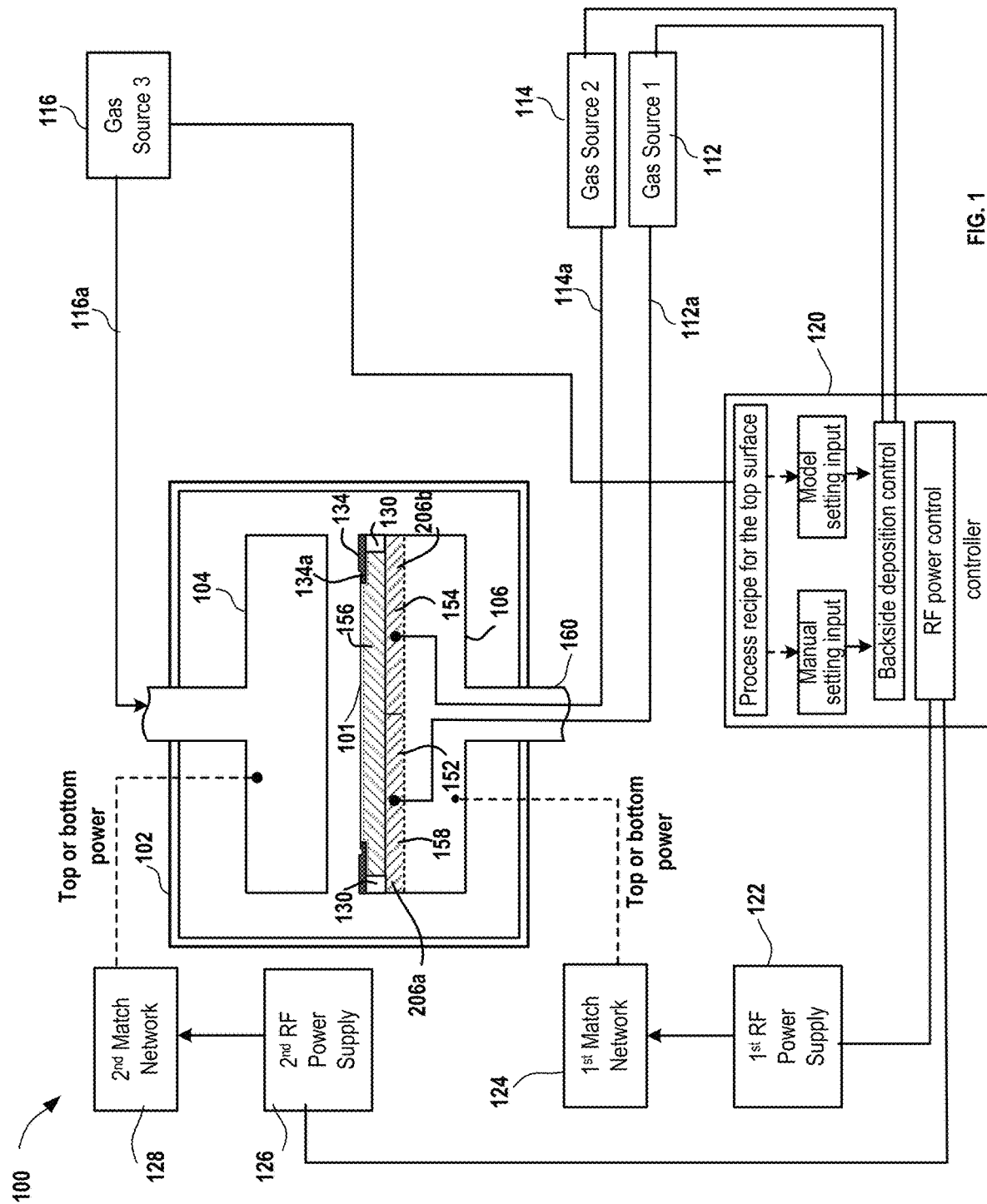
FIG. 1 illustrates a simplified block diagram of a wafer processing system configured for back-side wafer deposition, in accordance with some embodiments.

Embodiments of the disclosure provide embodiments of a process chamber, used for processing semiconductor wafers. In one implementation, a chamber is configured with a lower electrode showerhead configuration that enables back-side deposition to counteract wafer bowing and/or stresses as more layers are formed on the top-side of the substrate.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, although substrates with 450 mm diameter or higher or lower than 200 mm can also be envisioned. The description herein uses the terms "front" or "top" side and "back" or "underside" to describe the different sides of a wafer that can be exposed to one or more process gases during deposition or etching. It is understood that the front or the top side is where most deposition and processing occurs, and where the semiconductor devices themselves are fabricated. The back or the underside is the opposite side of the wafer, which typically experiences minimal or no processing during fabrication.

The multi-level semiconductor processing flow to manufacture advanced memory and logic chips has caused substrates to bow significantly in compressive and tensile directions. The deformation of the surface of the wafer can be attributed to the compressive and/or tensile properties of the films that are being deposited on the surface of the wafer. Due to this substrate bowing (either moderate or severe bowing), processing conditions of various manufacturing processes are compromised causing process control issues, lithography chucking and overlay issues, which sometimes cause increases in yield loss.

One way to address the bowing, according to an embodiment, is to deposit one or more sacrificial films on the back side of the wafer to compensate for the bowing on the front side so as to result in a substantially flat wafer. The amount, type of material used in the sacrificial films and the location where the sacrificial films are deposited on the underside may depend on the amount, type of material and location where the thin films are deposited on the front side. The traditional PECVD systems have one gas-flowing electrode that can be RF powered or ground. Typically, the gas flowing electrode (also referred to as upper electrode showerhead or simply upper electrode 104) is disposed in the top portion of the PECVD systems causing the reactants to generate plasma over the front-side or top side of the wafer leading to the deposition of films only on the front-side or top side of the wafer. However, in order to address the bowing, the sacrificial films have to be formed on the back side or the underside surface of the wafer. In order to form the sacrificial films on the back side of the wafer, the plasma for depositing sacrificial films has to be formed over the back side (i.e., the underside surface) of the substrate.

In accordance with one embodiment, a deposition system (e.g., a PECVD system) is disclosed that addresses this discrepancy by including dual gas-flowing electrodes. One gas-flowing electrode is defined in the top portion of the chamber and a second one is defined in the bottom portion and oriented opposite to the top gas-flowing electrode (also referred to herein as "upper showerhead" or "upper electrode"). Either one of the electrodes can be an RF electrode to provide AC fields enabling plasma generation for film (e.g., CVD film) depositions. This dual gas-flowing electrode PECVD system is configured to selectively deposit films on only the top surface, or only the underside surface, or on both top and underside surfaces of the wafer. In one example implementation, the lower gas-flowing electrode (referred to herein as a "lower electrode showerhead" or simply "lower showerhead" or "shower pedestal" or "ShoPed") may be part of a multi-station chamber or a single-station chamber. Accordingly, the ShoPed includes a wafer support for receiving and holding a carrier ring with a wafer that is transferred into the chamber or to a station of the multi-station chamber. The ShoPed is connected to a first process gas source through a first gas feed for receiving a first process gas, and to a second process gas source through a second gas feed for receiving a second process gas. The upper showerhead is connected to a third process gas source through a third gas feed for receiving a third process gas.

In one embodiment, the back-side process gas flow enables the PECVD deposition on the back-side of the wafer while the front-side process gas flow can enable deposition on the front side of the wafer. The system can be setup to selectively enable the side of the deposition by turning on and off the gas feeds connected to the corresponding process gas sources that cause the film deposition on specific sides. For instance, if the back side of the wafer has to undergo deposition, then the gas feed(s) that provides the process gas(es) to the back side of the wafer is turned on and the gas feed that provides the process gas to the front side is turned off. In some implementations, the side that is not being actively treated with the plasma, may instead be treated with non-reacting gases (e.g., inert gases). In such implementations, the gas feed that was used to supply the process gas to the non-treating side during deposition on the treating side, may instead be connected to a non-reacting gas source (e.g., inert gas source). In the above example where the back side of the wafer is being treated with process gas(es), the gas feed(s) to the front side of the wafer may be connected to an inert gas source to allow the inert gas to be supplied to the front side while the process gas(es) are being supplied to the back side of the wafer. This would prevent the by-products that escape from the front side from making their way to the back side and adhering to the back side surface. Another aspect of this system is the ability to control a distance of side of the substrate from the reactant flowing gases and/or the confinement of the process gas(es) within the corresponding plasma processing region. This control enables achieving the deposition profile and film properties that are needed for the applications, such as back-side compensation.

The ShoPed and the upper showerhead include configurations that provide showerhead-like features that enable proper mixing of reactant gases and proper application of appropriate flow dynamics to carry out PECVD deposition processes on the back-side or the front side of the wafer. Additionally, some embodiments enable for a controllable gap that can suppress or allow the plasma on the desired (one or both) sides of the wafer for deposition. The gaps being controlled can include, e.g., a gap spacing between a top side of the wafer and the bottom surface of the upper showerhead 104, and a gap spacing between a back side of the wafer and the top surface of the ShoPed 106. For example, while the back side of the wafer is being deposited, the gap between the top side of the wafer and the bottom surface of the upper showerhead may be adjusted to be minimal to prevent plasma formation. By way of example, this separation may be between about 0.5 mm and about 2 mm, and in another embodiment, between about 0.5 mm and about 1 mm (depending on wafer bow limits).

The ShoPed 106 is further configured to include a showerhead outlet pattern and inner plenums for either even distribution of gases (i.e., to allow for process gases to be delivered toward the bottom of the wafer) or for differential distribution of gases. The embodiments also allow for the gas-flowing pedestal (i.e., ShoPed) to have an active heater to get the process gas to the proper temperature. The combination of the ShoPed 106 and showerhead 104 allows for the concurrent function of both of key attributes. The ShoPed 106 can, in one embodiment, still heat the wafer and provide the wafer transfer features within the multi-station reactor chamber, or from within to outside of the reactor chamber or vice versa, while the showerhead 104 components allows for process gas flow to perform deposition on the top surface of the wafer. The gas-flowing pedestal (i.e., ShoPed) disclosed herein therefore enable implementation of traditional PECVD processes to deposit on either side of the wafer, selectively. These configurations are also configured to selectively RF power the upper electrode or the bottom ShoPed, and dynamically enable/disable the plasma on the side of the wafer that needs deposition. Additionally, the ShoPed may also be configured to selectively RF power different zones defined within the ShoPed for selective deposition on the different portions defined on the underside surface of the wafer.

Broadly speaking, the ShoPed provides several advantages for combating the stress and bowing issues by depositing a film on the back side of the wafer. The back side film counteracts the stress from the front side deposition to result in a neutral stress (or substantially neutral stress, e.g., less than about +/−150 MPa) wafer that shows no bowing (or substantially no bowing, e.g., less than about 150 μm of bow). If the film deposited on the front side is tensile, then the film used for back side deposition should also be tensile to balance out the overall stress. Likewise, if the front side film is compressive, then the back side film should also be compressive. The back side film may be deposited through various reaction mechanisms (e.g., chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), etc). In various cases, PECVD is used due to the high deposition rate achieved in this type of reaction.

Certain deposition parameters can be tuned to produce a back side film having a desired stress level. One of these deposition parameters is the thickness of the deposited back side film. Thicker films induce more stress in the wafer, while thinner films (of the same composition and deposited under the same conditions) induce less stress in the wafer. Therefore, in order to minimize the amount of material consumed in forming the back side layer, this layer may be deposited relatively thinly under conditions that promote formation of a highly stressed film. Another one of the deposition parameters that can be tuned is number of layers of different films that need to be deposited. The number of layers of films formed on the back side may be equal to or less than the number of films deposited on the front side of the wafer, and these numbers may depend on the type of process gases that are used, the tensile or compressive properties of the films, the thickness of each film, and the overall stress that needs to be mitigated.

As mentioned, stacks of deposited materials are especially likely to result in wafer stress and bowing. One example stack that may cause these problems is a stack having alternating layers of oxide and nitride (e.g., silicon oxide/silicon nitride/silicon oxide/silicon nitride, etc.). Another example stack likely to result in bowing includes alternating layers of oxide and polysilicon (e.g., silicon oxide/polysilicon/silicon oxide/polysilicon, etc.). Other examples of stack materials that may be problematic include, but are not limited to, tungsten and titanium nitride. The materials in the stacks may be deposited through chemical vapor deposition techniques such as plasma enhanced chemical vapor deposition (PECVD), low pressure chemical vapor deposition (LPCVD), metal organic chemical vapor deposition (MOCVD), atomic layer deposition (ALD), plasma enhanced atomic layer deposition (PEALD), or through direct metal deposition (DMD), etc. These examples are not intended to be limiting. Certain disclosed embodiments may be useful whenever wafer stress and/or bowing are induced due to material present on the front side of the wafer.

The front side stacks may be deposited to any number of layers and thicknesses. In a typical example, the stack includes between about 32 to about 72 layers, and has a total thickness between about 2 μm to about 4 μm. The stress induced in the wafer by the stack may be between about −500 MPa to about +500 MPa, resulting in a bow that is frequently between about 200-400 μm (for a 300 mm wafer), and even greater in some cases.

In certain implementations the back side layer may be removed after further processing. Where this is the case, the composition of the films deposited on the back side should be chosen such that it can be easily removed from the substrate at an appropriate time. In this regard, there should be a high selectivity between the material of the back side layer (e.g., the dielectric) and the material of the underlying substrate (e.g., silicon) in the desired removal chemistry.

The optimal thickness of the back side layer will depend on the amount of stress induced by the deposition on the front side of the wafer, as well as the conditions under which the back side layer is deposited. The back side layer may be deposited to a thickness at which the stress in the wafer becomes negligible (e.g., less than about 150 MPa). The thickness of the back side layer deposited may be controlled to make the wafer bow fall under a negligible range (e.g., less than about 150 μm of bow). In some cases, this corresponds to a back side layer thickness between about 0.1-2 μm, for example between about 0.3-2 am, or between about 0.1-1 μm, or between about 0.3-1 μm. Where silicon nitride is used to form the back side layer, a film having a thickness of about 0.3 μm is sufficient to mitigate a bow of about 50-200 μm. As mentioned above, a higher stress back side layer may be selected to reduce the required thickness of the layer. This helps conserve materials and reduce costs. For more information regarding backside deposition techniques, reference may be made to U.S. patent application Ser. No. 14/285,554, which is owned by the same assignee as the present application, and is herein incorporated by reference. For additional details of using the dual gas-flowing electrodes and for some references to composition of films formed on the underside surface of the substrate, reference may be made to U.S. patent application Ser. No. 15/692,300, assigned to the same assignee as the present application, and is incorporated herein by reference.

It should be appreciated that the present embodiments can be implemented in numerous ways, such as a process, an apparatus, a system, a device, or a method. Several embodiments are described below.

Deposition of films is in one embodiment implemented in a plasma enhanced chemical vapor deposition (PECVD) system. The PECVD system may take many different forms. The PECVD system includes one or more plasma processing chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a plasma processing chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

FIG. 1 illustrates a substrate processing system 100, which is used to process a wafer 101. The system includes a plasma processing chamber 102. In one implementation, the plasma processing chamber (or simply referred to herein as "chamber") 102 is a single-station chamber, as illustrated in FIG. 1. In alternate implementations, the plasma processing chamber 102 may be multi-station chamber, as will be described with reference to FIGS. 2 and 3. A bottom portion of the chamber 102 includes a pedestal 106. The pedestal 106 is, in accordance with embodiments disclosed herein, referred to as a showerhead pedestal (or simply referred to herein as "ShoPed"), in that a showerhead is defined on a top surface of the pedestal and is configured to provide process gases to an underside surface of a wafer 101. A center column 160 is configured to support the ShoPed 106. An outer edge on the top surface of the ShoPed 106 includes a support surface, such as a carrier ring support region, to provide support to a carrier ring 134, when received inside the plasma processing chamber 102. The carrier ring 134 is configured to support the wafer 101 and is used to move the wafer into the process chamber for deposition and to remove the wafer after the deposition. The carrier ring 134 exposes the top surface as well as the underside surface of the wafer 101 for film deposition, depending on which side of the wafer 101 is being processed. An upper showerhead 104 is disposed in a top portion of the plasma processing chamber 102 and is oriented opposite to the ShoPed 106. The upper showerhead 104 is connected to a process gas source (e.g., third process gas source 116) through a corresponding gas feed (e.g., gas feed 116a) for receiving a process gas (e.g., third process gas).

In one embodiment, the ShoPed 106 is electrically coupled to a first power supply (e.g., first radio frequency (RF) power supply) 122 via a match network 124 and the upper showerhead 104 is electrically coupled to a second power supply (e.g., second RF power supply) 126 via a match network 128. The first RF power supply 122 and the second RF power supply 126 are connected to a control module 120, (e.g., a controller) and are controlled by a RF power control code defined within the controller 120 to supply power to the upper showerhead 104 and/or the ShoPed 106. In some embodiments, it is possible to configure the controller 120 to provide power to only the ShoPed 106 instead of the upper showerhead 104 in order to allow deposition of films in different portions on the underside surface of the wafer 101. In alternate embodiments, it is possible to configure the controller 120 to provide power to only the upper showerhead 104 in order to allow deposition of films only on the top surface of the wafer 101. In additional embodiments, it may be possible to configured the controller 120 to provide power to both the upper showerhead 104 and the ShoPed 106 so as to allow deposition of films on both the top surface and the underside surface of the wafer 101.

The control module 120 is configured to operate the substrate processing system 100 by executing process input and control for specific process recipes for depositing films either on the top surface or the underside surface of the wafer 101. Irrespective of which surface of the wafer 101 is receiving a deposited film, the controller module 120 sets various operational inputs, for the specific process recipes, e.g., such as power levels, timing parameters, process gasses, mechanical movement of the wafer 101, height of the wafer 101 off of the ShoPed 106, thickness of the film, etc., and such process recipes may be based on location where the film is to be deposited, properties of the process gases used for depositing the film (e.g., tensile or compressive property), etc. In some embodiments, the operational inputs for the process recipes for depositing films on the underside surface of the wafer (i.e., backside deposition control) may be determined based on the process recipes used for depositing films on the top surface of the wafer 101. For instance, the process recipes used for the top side film may be used to manually provide operational inputs to a manual setting input code within the controller 120 for determining the process recipes for backside deposition. Alternately, the process recipes used for depositing the top side film layers may be used as setting inputs to a mathematical model by a model setting input code of the controller 120 to determine the process recipes for controlling backside deposition. The mathematical model may be generated and trained by a machine learning algorithm, which uses the process recipes related to the top side deposition from multiple wafer processing, as inputs. The aforementioned list of operational inputs for the process recipes have been provided as a mere example and should not be considered exhaustive or limiting.

In one embodiment, the mathematical model is generated by first running test wafers through various deposition processes and examining the wafers that have bow to determine factors that caused the bow. The deposition processes are used to define different films on different sections on a top surface of a wafer to define a device. Metrology tools are used to analyze the attributes of the various films and determine the factors that cause the bow. For example, the analysis may be used to identify which films in which sector or section caused the bow, the thickness of the film, the tensile or compressive property of the film that caused the bow, and the amount of bowing that was caused as a result of deposition of the different films. The metrology tool can engage microscopes or laser lights or any other tools or means to quantify the bow. The data collected by the metrology tool from examining the wafer are used as inputs by a machine learning algorithm to generate the mathematical model. The generated model is then trained by running additional test wafers and using the data from the additional test wafers. The trained model may identify characteristics of the films that are deposited to define a particular device (e.g., a 3D NAND, memory chip, processor, etc.,), and the factors (thickness, location, tensile/compressive property, etc.,) that caused the bowing. So, in one embodiment, when a wafer is received for forming a particular type of device, the trained model may be used to identify the factors that caused the bow for the particular type of device, and perform the back side deposition ahead of the deposition on the front side of the wafer for forming the device, and the back side deposition is done in anticipation that a wafer bow will occur from the films used on the top side. The trained model may be used to identify a type of material that needs to be used, the thickness of the film that needs to be deposited on the back side, the section of the back side of the wafer that the film needs to be deposited, number of layers of films, etc., to compensate for the bow. In another embodiment, the trained model may be used to figure out what type of films need to be formed on the back side of the wafer after deposition of few layers of films on the front side and perform the back side deposition in multiple passes to compensate for the bowing as the layers of the device are being built on the front side. Thus, the data from the model can be used to perform the back side deposition at different stages of the device that is being built on the front-side or at the beginning or at defined periods, etc. The model generated by the machine learning algorithm not only gets trained by examining the test wafers but may also get trained by examining live wafers using in situ metrology tools.

In some embodiments, the carrier ring support region on the outer edge of the ShoPed 106 may include spacers 130 that are distributed uniformly along the support region to allow an end effector of a robot (not shown) of the process chamber to place the carrier ring 134 with the wafer 101 over the spacers 130. The carrier ring 134 includes a step-down bottom extension 134a defined along an inner radius that is used to support the wafer 101. A plurality of contact supports may be defined on the bottom extension 134a for seating the wafer 101. Features defined on the spacers 130 may be used to reliably receive the carrier ring 134 on the spacers 130. As will be described below, the spacers 130 are sized to provide a controlled separation between an underside surface of the wafer 101 received on the carrier ring 134 and the top surface of the ShoPed 106. The size of the spacers 130 further ensure that a controlled separation exists between a bottom surface of the upper showerhead 104 (facing the wafer) and the top surface of the wafer 101.

In an alternate embodiment, the edge of the ShoPed may include a lift pin mechanism (not shown) that can be used to place and retrieve a carrier ring 134 with a wafer 101. The lift pin mechanism may be provided in place of the spacers 130. In this arrangement, the lift pin mechanism may be used to receive the carrier ring 134 with the wafer 101. The lift pin mechanism includes a plurality of lift pins coupled to a lift pin control. The lift pins may be housed within a housing defined in the peripheral region of the ShoPed 106 and may be configured to extend out to a raised position through holes defined along the peripheral region of the ShoPed 106, when the lift pins are activated by the lift pin control, and retract into the housing, when the lift pins are deactivated. The lift pins may be activated when the carrier ring 134 with the wafer 101 is received on the ShoPed 106 and may remain activated when the underside surface of the wafer 101 has to undergo deposition. The activated lift pins provide the necessary support for an end-effector to place and retrieve the carrier ring 134 with the wafer 101, when the carrier ring and the wafer 101 is received or removed from the process chamber. The retrieved carrier ring 134 with the wafer 101 may be moved to a next station or out of the processing chamber.

The ShoPed 106 is designed to allow deposition of different films in different regions on the underside surface of the wafer 101. Accordingly, the ShoPed 106 includes a first zone and a second zone defined inside the ShoPed 106. The first zone 152 is connected to a first process gas source 112 via a first feed 112a and includes a first inner plenum 206a to receive a volume of a first process gas from the first process gas source 112. The first process gas from the first inner plenum 206a is used to deposit a first film in a first region on the underside surface of the wafer 101 that corresponds with the first zone. To that effect, the first inner plenum interfaces with a first set of outlets defined on the top surface of the ShoPed 106 to allow the first process gas to be provided over the first region for depositing the first film. The second zone 154 is connected to a second process gas source 114 through a second feed 114a and includes a second inner plenum 206b to receive a volume of a second process gas from the second process gas source 114. The second process gas from the second inner plenum 206b is used to deposit a second film in a second region on the underside surface of the wafer 101 that corresponds with the second zone. To that effect, the second inner plenum interfaces with a second set of outlets defined on the top surface of the ShoPed 106 to allow the second process gas to be provided over the second region for depositing the second film.

Separator fins are provided inside and outside the ShoPed 106 to confine the first and the second process gases over the specific regions of the wafer 101. For instance, a lower separator fin 158 is defined inside the ShoPed 106 to separate the first inner plenum of the first zone from the second inner plenum of the second zone. An upper separator fin 156 is defined on the top surface of the ShoPed 106 facing the wafer 101, and is aligned with the lower separator fin 158. The upper separator fin 156 defines the boundaries of the first film and the second film formed on the wafer 101. Details of the geometry and location of the upper separator fin 156 will be discussed in more detail with reference to FIGS. 4A-4D. Similarly, details of the lower separator fin 158 will be discussed in more detail with reference to FIGS. 4E-4F. A height of the upper separator fin 156 is engineered to provide a film of certain thickness. Further, the height of the upper separator fin 156 is defined so that the underside surface of the wafer 101 is spaced apart from a tip of the upper separator fin 156, but is still able to confine the process gases over the respective regions. As a result, the process gases directed toward the underside surface of the wafer 101 are confined by the upper separator fin 156 to regions in the underside surface of the wafer 101 that correspond with the first and the second zones, respectively, so that a first film or a second film can be formed in the respective regions. For example, in one embodiment where the carrier ring 134 with the wafer 101 is received on spacers 130, a height of the upper separator fin 158 may be defined to be shorter than the spacers 130 so that a tip of the upper separator fin 156 is just below the underside surface of the wafer 101 and a separation distance exists between the tip of the upper separator fin 156 and the underside surface of the wafer 101, when the wafer 101 with the carrier ring 134 is received on the spacers 130. Further, the upper and the lower separator fin 156 allow simultaneous deposition of different films by providing zonal separation necessary to keep the films separate.

The support surfaces, such as spacers 130, provide a complementary mating surface for any ring extensions defined in the carrier ring 134 so that the carrier ring 134 is prevented from sliding or moving when supported by the spacers 130. In one embodiment, three spacers 130 are provided. However, the embodiment is not restricted to 3 spacers and it is envisioned that any number of spacers may be provided, so long as the carrier ring 134 can be supported substantially parallel to the surface of the ShoPed 106, and spacing is defined for supporting the wafer 101 at a spaced apart relationship from a top surface of the ShoPed 106.

The height of the spacers 130 and the height of the upper separator fin 156 is defined so that a separation distance exists between the underside surface of the wafer 101 and the tip of the upper separator fin 156. In another implementation, the height of the upper separator fin 156 is defined to be equal to a height of the spacers 130. In this implementation, a separator distance may still exist between the tip of the upper separator fin 156 and the underside surface of the wafer 101 and that separator distance may be equal to a thickness of a bottom extension 134a of the carrier ring 134 on which the wafer 101 is received. The spacers 130 and the upper separator fin 156 provide for a zonal separation that optimizes deposition to the underside surface of the wafer 101 by confining the deposition of the films to areas that correspond with the first and the second zones. Further, by controlling operation of the ShoPed 106 and the upper showerhead 104, deposition over the top surface of the wafer 101 can be reduced when deposition of the underside surface of the wafer 101 is taking place.

The first gas source 112 and the second gas source 114 that the ShoPed 106 is connected to may be gas chemistry supplies from a facility and/or inert gases. Depending on the type of deposition being performed on the underside surface of the wafer 101, the controller 120 controls the selection and delivery of process gases from appropriate process gas sources 112, 114, via the respective gas feeds 112a, 114a. The selected process gases are supplied to the respective first or second inner plenums 206a, 206b and from the respective first or second inner plenums to a space volume defined between the upper surface of the ShoPed 106 and the underside surface of the wafer 101, when the wafer 101 is resting over the spacers 130 on the ShoPed 106. In some implementations, the controller 120 may be configured to control the delivery of the first process gas and the second process gas in a sequential manner to deposit a first film and a second film in the respective regions defined on the underside surface of the substrate. For example, the controller 120 may control the delivery of the first process gas so as to form a first film in the first region on the underside surface of the wafer 101 that corresponds to the first zone of the ShoPed 106. After the first film is deposited, the controller 120 may control the delivery of the second process gas so as to form a second film in the second region on the underside surface of the wafer 101 that corresponds to the second zone of the ShoPed 106. In an alternate implementation, since the first zone and the second zone are distinctly separated by the upper separator fin and the lower separator fin, the controller may be configured to control the delivery of both the first and the second process gases simultaneously to form the first film and the second film in the respective regions on the underside surface of the wafer 101.

During the deposition of the different films on the underside surface of the wafer 101, the gas feed 116a to the upper showerhead 104 may be turned off so as to ensure no process gas is applied to the top surface of wafer 101 while films are being deposited on the underside surface of the wafer 101. Alternately, the upper showerhead 104 may be used to provide inert gas to the top side of the wafer 101. The inert gas may be used to push the reactant gases used for depositing on the underside surface, away from the top surface so that the reactant gases may be directed to the underside surface of the wafer 101. In such cases, the gas feed 116a may be connected to an inert gas source, instead of a reactant process gas source. In another implementation, the upper showerhead may be used to deposit films on the top side of the surface while simultaneously the ShoPed may be used to deposit one or more films on the underside surface of the substrate. In some implementation, the process gases used to deposit films on the underside surface may be of the same composition and have the same properties as the process gases used to deposit films on the top surface. In some other implementations, the process gases used to deposit films on the top surface may be different from the process gases used to deposit films on the underside surface. The operational inputs for the process recipes that are used to define the number of films, type of process gases, location of the films, and/or thickness of the film deposited on the underside surface may be driven by the process recipes used for depositing the various films on the top side of the wafer 101 and the properties of the films formed on the top surface of the wafer 101. The configuration of the different zones in the ShoPed 106, including size, shape contour, location, etc., may be determined by the mathematical model based on input obtained from incoming wafer and such determination can be done using a machine learning algorithm, or alternately could be predetermined through a production line or equipment capable of in situ metrology.

Further, the process gases used for depositing films on the top side and the underside surface may be premixed or not. Appropriate valving and mass flow control mechanisms may be employed within the respective gas feeds 112a, 114a, 116a to ensure that the correct process gases are delivered during the plasma treatment phases (e.g., deposition phases) of the deposition process for the top side and the underside surface. Process gases exit chamber via an outlet (not shown). A vacuum pump (e.g., a one or two stage mechanical dry pump and/or a turbomolecular pump) (not shown) draws process gases out and maintains a suitably low pressure within the reactor by a close loop controlled flow restriction device, such as a throttle valve or a pendulum valve. As mentioned previously, the reactor may be part of a single-station chamber or could be a multi-station chamber.

In one embodiment, an end-effector that may be used to move the carrier ring 134 with the wafer into and out of a chamber or station may be a set of spider forks (not shown). The spider forks include extended arms that are used to support the carrier ring when the carrier ring is moved from one station to another station within the processing chamber or for moving the carrier ring into and out of the processing chamber 100.

Figure 3:
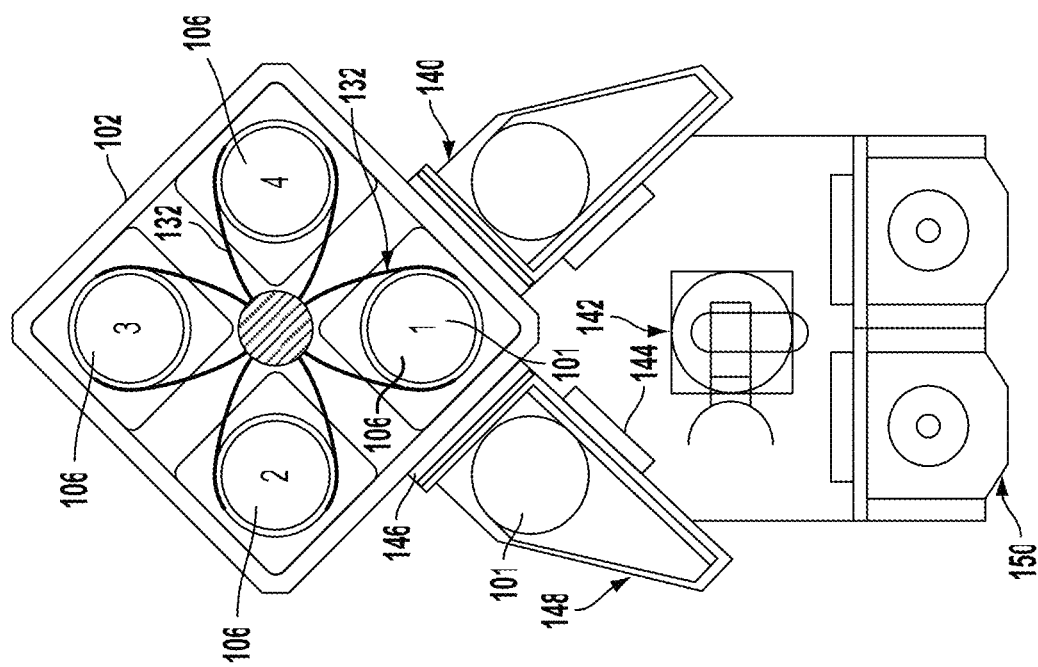
FIG. 3 shows a schematic view of an embodiment of a multi-station processing tool with an inbound load lock and an outbound load lock, in accordance with one embodiment.
Figure 2:
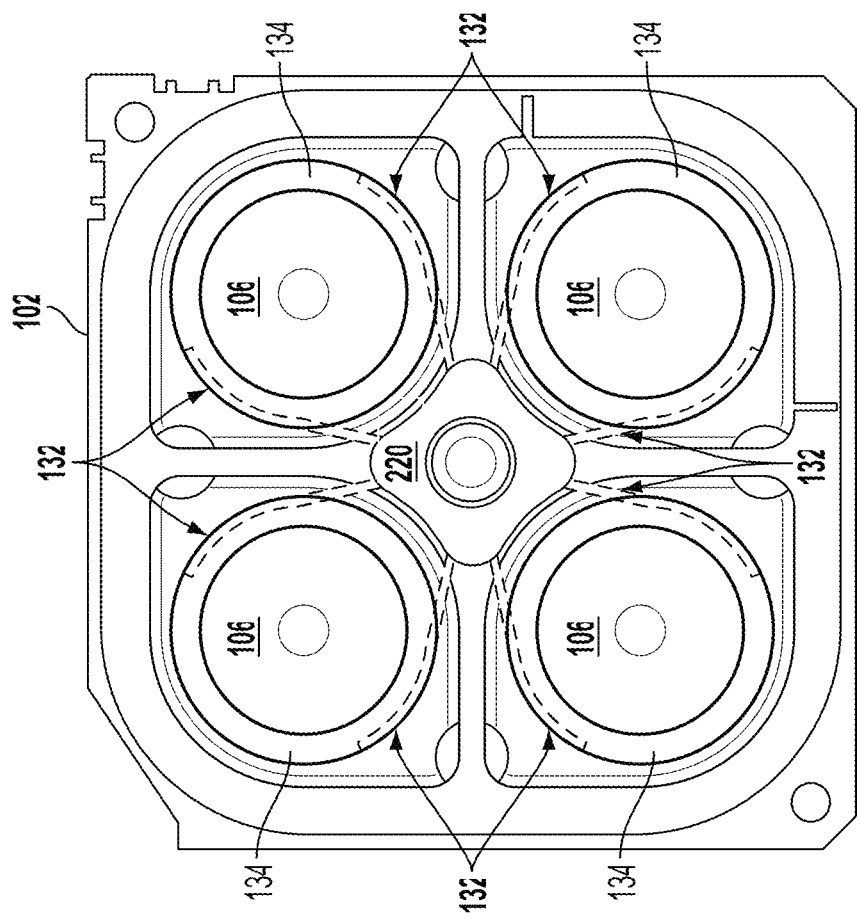
FIG. 2 illustrates a top view of a multi-station processing tool, wherein four processing stations are provided with each of the processing stations being configured for back-side wafer deposition, in accordance with one embodiment.

FIG. 2 illustrates a top view of a multi-station processing tool, wherein four processing stations are provided. The embodiment of FIG. 1 illustrates a chamber 102, which can be implemented in multi-station processing tool of FIGS. 2 and 3, which have four chamber stations. FIGS. 2 and 3 provide top views of a chamber portion (e.g., with a top chamber portion removed for illustration), wherein four stations are accessed by spider forks 132. Each spider fork 132, or fork includes a first and second arm, each of which is positioned around a portion of each side of the ShoPed 106. In this view, the spider forks 132 are drawn in dash-lines, to convey that they are below the carrier ring 124. The spider forks 132, using an engagement and rotation mechanism 220 are configured to raise up and lift the carrier rings 134 (i.e., from a lower surface of the carrier rings 134) from the stations simultaneously, and then rotate at least one or more stations before lowering the carrier rings 134 (where at least one of the carrier rings supports a wafer 101) to a next location so that further plasma processing, treatment and/or film deposition can take place on respective wafers 101. In one embodiment, the spider forks 132 can be used to raise the carrier ring 134 with the wafer 101 to a height that enables deposition on a backside of the wafer 101, while substantially preventing deposition on a topside of the wafer 101.

FIG. 3 shows a schematic view of an embodiment of a multi-station processing tool with an inbound load lock 148 and an outbound load lock 140. A robot 142 located within an atmospheric transfer module maintained at atmospheric pressure, is configured to move wafers 101 from a cassette loaded through a pod 150 into inbound load lock 148 via an atmospheric port 144. Inbound load lock 148 is coupled to a vacuum source (not shown) so that, when atmospheric port 144 is closed, inbound load lock 148 may be pumped down to vacuum. Inbound load lock 148 also includes a chamber transport port 146 interfaced with processing chamber 102. Thus, when chamber transport port 146 is opened, another robot (not shown) may move the wafer from inbound load lock 148 to a ShoPed 106 of a first process station for processing.

The depicted process chamber 102 comprises four process stations, numbered from 1 to 4 in the embodiment shown in FIG. 3. In some embodiments, processing chamber 102 may be configured to maintain a low pressure environment so that substrates may be transferred using a carrier ring 134 among the process stations without experiencing a vacuum break and/or air exposure. Each process station depicted in FIG. 3 is a ShoPed 106 that is configured to deliver a process gas to an underside surface of the wafer 101 when backside deposition is to occur. During backside deposition, whether spacers or spider forks or lift pins or paddles are used to raise the wafer off of the ShoPed 106, the showerhead 104 may be configured, in some embodiments, to supply an inert gas over the top surface of the substrate to prevent or reduce deposition over the top surface of the wafer 101.

FIG. 3 also depicts spider forks 132 for transferring wafers within processing chamber 102 and lifting the wafer 101 during backside deposition. As will be described in more detail below, the spider forks 132 can also rotate and enable transfer of wafers from one station to another. The transfer occurs by enabling the spider forks 132 to lift carrier rings 134 from an outer undersurface, which then lifts the wafer, and then rotates the wafer and the carrier ring 134 together to the next station. In one configuration, the spider forks 132 are made from a ceramic material to withstand high levels of heat during processing.

In other embodiments, instead of using spider forks 132 to lift and transfer the wafers, a paddle type structure can also function to lift and transfer the wafers. Paddles can be disposed between the stations, similar to the way the spider forms 132 sit, and can function in the same way. Thus, for easy of understanding, references to spider forks 132 should be understood to also apply to paddle configurations, which can provide the control lifting of the wafers during backside wafer deposition and transfers between stations.

It should be understood that the embodiment illustrate in FIG. 3 may also be extended to different processing tool configurations including processing tools in which a plurality of multi-station processing chambers are distributed along different sides of a vacuum transfer module. In addition to the multi-station processing chambers that are disposed on different sides, the vacuum transfer module also includes one side that interface with an inbound load lock 148 and another side that interfaces with an outbound load lock 140. A robot in the vacuum transfer module may be used to move the wafer from the inbound load lock 148 to the processing chambers and from the processing chambers to the outbound load lock 140. The spider forks disposed in the processing chamber may be used to move the wafer from one station to another station within the processing chamber. As can be seen, the configuration of the processing tool depicted in FIG. 3 is just an example and that other configurations may also be envisioned for implementing the ShoPed defined in the various embodiments.

Broadly speaking, the embodiments disclosed herein are for a system to deposit PECVD films on the selective side of the wafer (front and/or back) with dynamic control for selecting a side of the wafer for undergoing deposition. One embodiment includes a dual gas-flowing electrode for defining a capacitively-coupled PECVD system. The dual gas-flowing system will include a gas-flowing showerhead 104 and a gas-flowing ShoPed 106. In one embodiment, the gas-flowing ShoPed is a combination showerhead and pedestal, which enables deposition on a back-side of the wafer. The ShoPed geometry combines features of a showerhead, e.g., such as a gas mixing plenum, outlets, outlet-pattern, gas jet preventing baffle, and features of a pedestal, e.g., such as embedded controlled heater, lift pin mechanisms, ability to hold plasma suppression rings, and movability. This enables the transfer of wafers and the processing of gasses with or without RF power.

Where lift pin mechanism is employed in the ShoPed to lift a carrier ring with a wafer 101, a height to which the lift pins may be extended may depend on the amount of gap that is present between the upper showerhead 104 and the ShoPed 106, as well as a thickness of the carrier ring 134. The lift pin mechanism is connected to a controller 120 to control the activation and deactivation of the lift pin mechanism.

In one embodiment, the gap between a non-treatment side of the wafer, when received in the chamber, and the electrode (upper showerhead 104 or ShoPed 106) is tightly controlled using the lift pin mechanism to a minimum value that is required to suppress plasma (otherwise there will be a plasma damage). Along similar lines, in the embodiment that includes spacers on the carrier-ring to receiving region of the ShoPed to space apart the ShoPed and the underside surface of the wafer 101, the height of the spacers is controlled to ensure that the gap between the non-treatment side of the wafer 101 and the surface of the electrode is sufficient to suppress formation of plasma on the non-treatment side.

In one example, this system allows minimal gap from about 2 mm to about 0.5 mm, and in another embodiment from about 1 mm to about 0.05 (limited by the wafer bow), and such gap can be controlled eight by the lift pin mechanism or the size of the spacers. In one embodiment, this gap depends upon the process conditions.

In one embodiment, the gas-flowing pedestal (i.e., ShoPed) enables, without limitation: (a) thermal stabilization of the wafer to processing temperature prior to processing; (b) selective design of outlet patterns on the ShoPed to selectively deposit different films in different areas of the back-side of the wafer (described in detail with reference to FIG. 4K); (c) swappable rings with specific outlet patterns can be attached to a top surface of the ShoPed to achieve appropriate plasma confinement; and (details of an alternate embodiment to FIG. 1 will be described with reference to FIG. 5A) (d) stable wafer support mechanisms, such as lift pin mechanisms, spacers, etc., defined within chamber for supporting the wafer 101 and dynamically controlling gaps between the wafer and the surface of the showerhead 104 during underside surface deposition, and wafer transfer mechanisms for transferring wafer outside to another station or chamber or cassette—such as spider forks, paddles, lift pins, RF-coupling features, etc.; and (e) implement gas mixing features, e.g., such as zones with multiple inner plenums, baffles, etc.; to enable selective gases to flow to different regions defined on the back side of the wafer and control flow rates via flow controllers.

The wafer support mechanisms enables: (a) control of the distance from deposition or reactant flowing electrode to the side of the wafer that needs deposition, or position in the middle of a gap between the upper showerhead and the ShoPed so that both sides can be deposited; and (b) to dynamically control the side that is to receive the deposition during the process (before plasma, during plasma, after plasma), profile of the deposition, and deposition film properties. In another embodiment, for a deposition mode used to deposit on the back-side of the wafer, a film edge exclusion control is highly desirable to avoid lithography-related overlay problems. The edge exclusion control is done via a carrier ring 134 that has a design feature to shadow the deposition on the edge, wherein the design feature includes size and shape of the carrier ring, size and shape of features formed on the underside of the carrier ring.

Figure 4A:
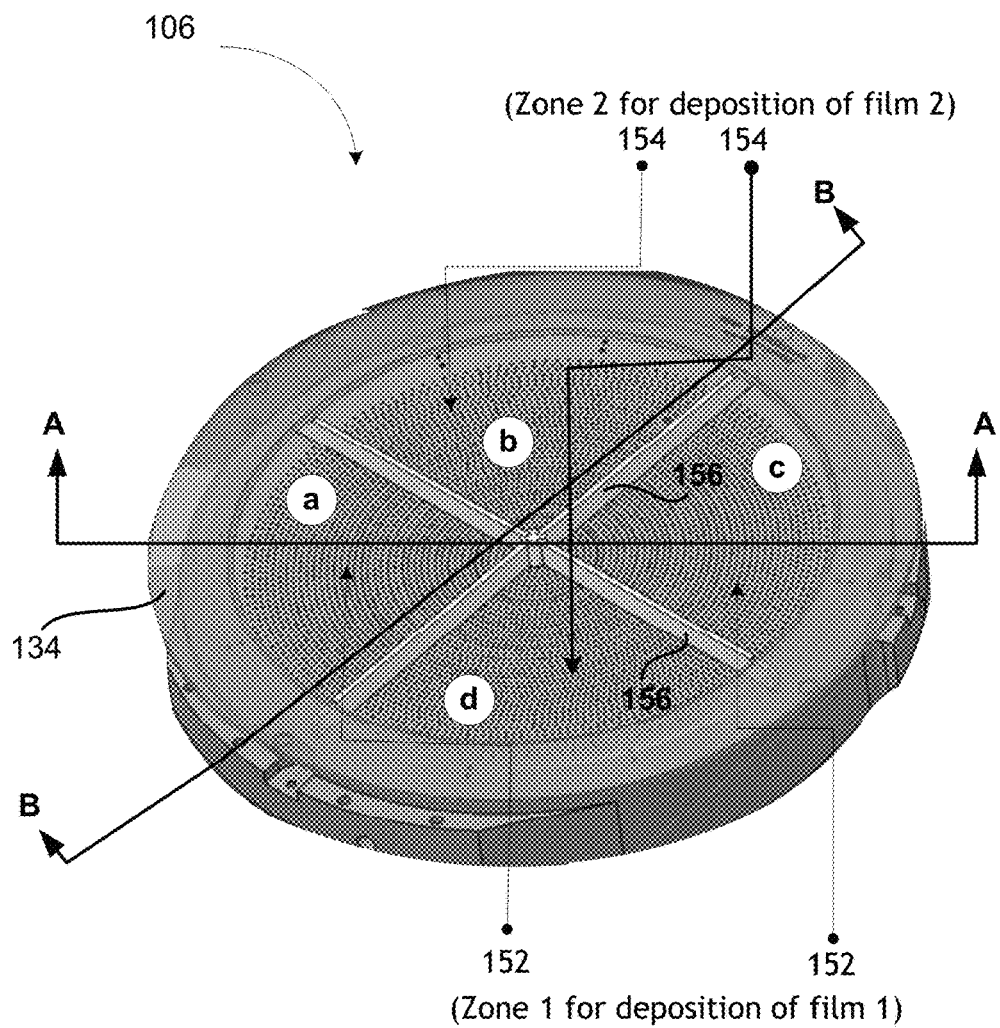
FIG. 4A illustrates a simplified schematic view of a showerhead pedestal identifying sectors representing the different zones designed for selective deposition of thin films on different regions defined on an underside surface of a wafer, in accordance with one embodiment.

FIG. 4A illustrates a perspective view of a ShoPed used in the process chamber for depositing different films on an underside surface of a wafer 101, in one embodiment. The ShoPed 106 shows the different zones that are defined using the lower and upper separator fins. In the perspective view of FIG. 4A, only the upper separator fin 156 is shown. A pair of upper separator fins 156 is diametrically disposed on the top surface of the ShoPed dividing the surface of the ShoPed into four different sectors, represented by reference letters "a", "b", "c" and "d". The two sectors "a" and "c" that are opposite to one another define zone 1 (152) while the two remaining sectors "b" and "d" define zone 2 (154). Although the embodiment identifies two zones, the different sectors defined by the current configuration of the upper separator fin 156 as well as the lower separator fin can very well be used to identify 4 zones, with each sector being associated with a different zone. The configuration of the separator fins (both upper and lower separator fins) that are shown in FIG. 4A are mere examples and that different orientations and/or different number of separator fins may be used to define fewer or additional zones. Each zone is connected to a corresponding inner plenum that receives process gas from a corresponding process gas source and includes a set of outlets for providing the process gas to an area above the surface of the substrate that corresponds with the respective zones.

The upper separator fin 156 defines a plasma generation region that is defined in a gap between the upper surface of the ShoPed and the underside surface of the wafer 101, when received in the chamber. The depth of the plasma generation region may be defined to be greater than the depth that would otherwise suppress plasma generation.

In one embodiment, the carrier ring 134 with the wafer may be received on top of the upper separator fin 156. FIG. 4A illustrates one such embodiment. In this embodiment, the carrier ring 134 may be supported on the edge region of the upper separator fin 156. To accommodate the carrier ring and to provide reliable support to the carrier ring, a top surface of the edge region of the upper separator fin 156 may be contoured to include a step-down feature on which the carrier ring 134 is received. A height of the step-down feature of the upper separator fin 156 may be defined to be shorter than a thickness of the carrier ring so that when the carrier ring is received on top of the upper separator fin 156, the wafer 101 received on the carrier ring is shown to be spaced apart from a top portion of the upper separator fin 156 and the height of the separation may be small to ensure that the process gas of the first zone does not flow into the area covered by the second zone and vice versa. Outlets are defined in each of the zones to allow the process gases to be provided for depositing the respective films. A size and distribution of the outlets in each of the zones may be similar or may be different. In the embodiment illustrated in FIG. 4A, the size and distribution of the outlets in each of the zones are same.

Figure 4B:
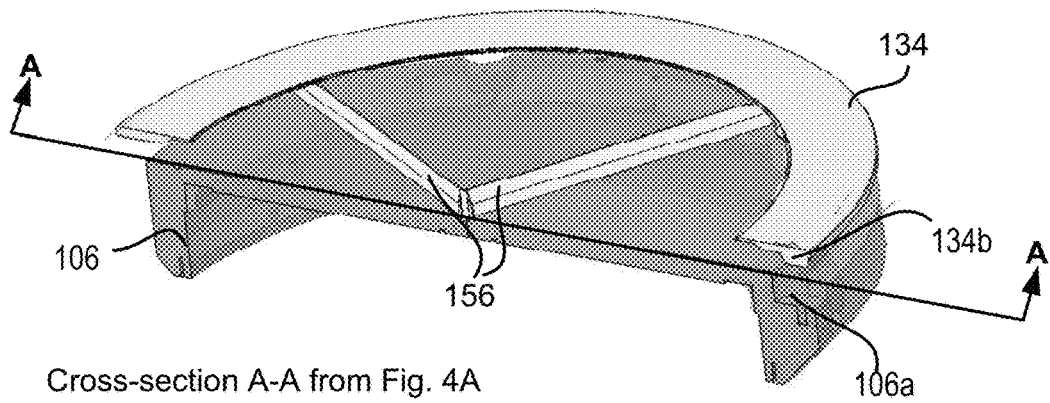
FIG. 4B illustrates a cross-sectional view of section A-A of the showerhead pedestal identified in FIG. 4A, in accordance with one embodiment.

FIG. 4B illustrates a cross-sectional view of section A-A of the ShoPed 106, identified in FIG. 4A. This cross-sectional view shows the orientation of the upper separator fin 156 as it extends from a center to the outer periphery of the ShoPed 106. Further, FIG. 4B illustrates a side extension 134b defined on an underside surface of the carrier ring 134 that is used to couple with a corresponding recess 106a defined along the outer edge of the ShoPed 106. A thickness of the side extension 134b may be greater than a height of the upper separator fin 156 so that the side extension 134b of the carrier ring 134 can be received into the recess 106a defined in the outer edge region of the ShoPed 106. As shown, a plurality of side extensions 134b is distributed along the circumference of the ShoPed 106 and the number of recesses 106a defined in the ShoPed 106 may match the number of side extensions 134b defined in the carrier ring 134.

Figure 4C:
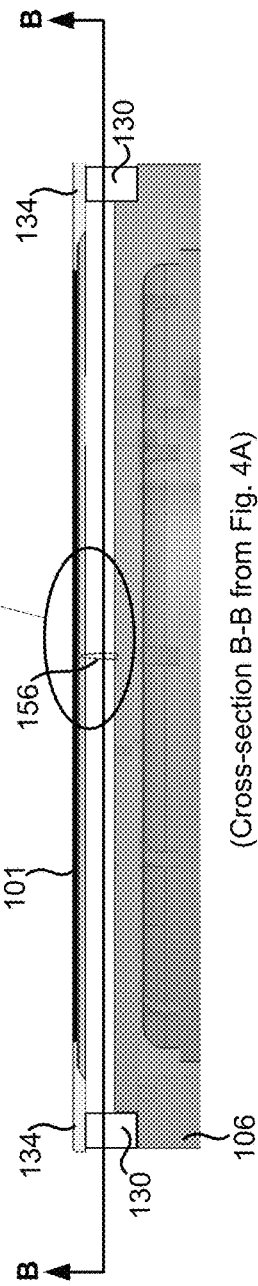
FIG. 4C illustrates a cross-sectional view of section B-B of the showerhead pedestal identified in FIG. 4A, in accordance with one embodiment.

FIG. 4C illustrates a cross-sectional view of section B-B of the ShoPed 106, from FIG. 4A. This cross-sectional view shows the upper separator fin 156 disposed in the center of the ShoPed with the edges of the ShoPed 106 including spacers 130 for receiving the carrier ring 134 with the wafer 101. The height of the spacer 130, in this embodiment, is shown to be shorter than a height of a portion of the upper separator fin 156 that is extending from the surface of the ShoPed 106. The upper separator fin 156 may be affixed to the top surface of the ShoPed 106 or a portion of the upper separator fin 156 may be embedded within the ShoPed 106.

Figure 4D:
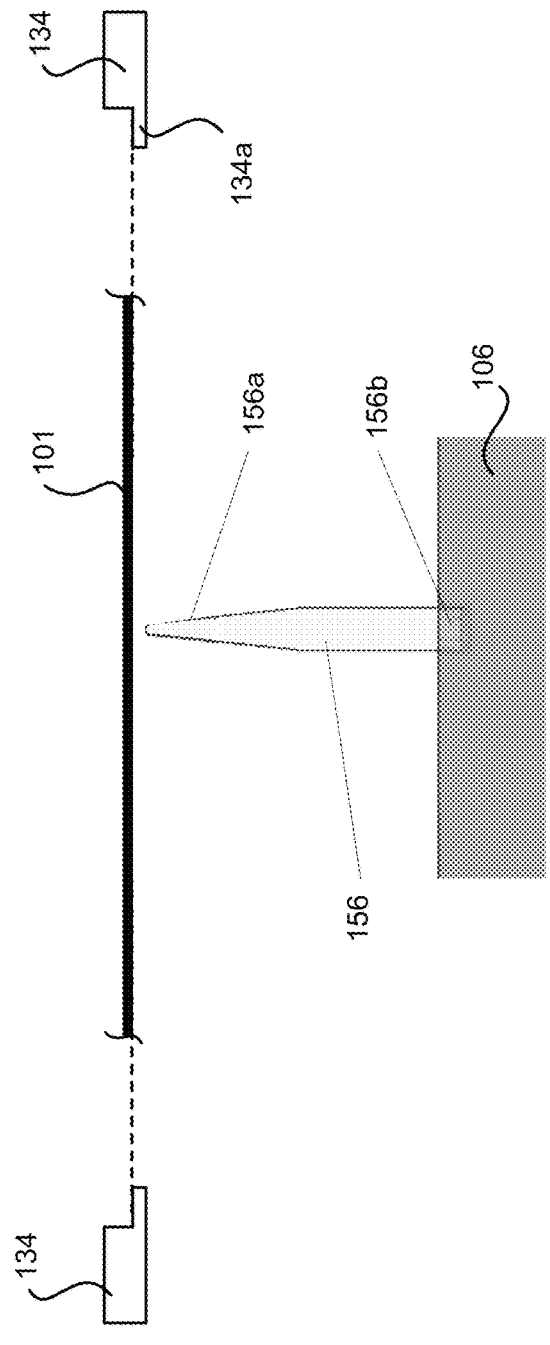
FIG. 4D illustrates an expanded view of a geometry of an upper separator fin used in defining the various zones on the showerhead pedestal, as disposed in relation to the substrate, in accordance with one embodiment.

FIG. 4D illustrates an embodiment in which a portion of the upper separator fin 156 is embedded within the ShoPed 106. The upper separator fin 156 may be of any design and may be oriented in different ways to define the different zones. Different shapes may be envisioned when designing the upper separator fin 156. In one embodiment, the upper separator fin 156 may be designed with a specific geometry so as to reduce a size (i.e., thickness) of the boundary between the first and the second films deposited on the underside surface of the wafer. For example, in the embodiment illustrated in FIG. 4D, the upper separator fin 156 includes a top tapered portion 156a, a flat bottom portion 156b and a body that extends between the top tapered portion 156a and the bottom flat portion 156b. A portion of the flat bottom portion 156b is embedded in the ShoPed 106. A height of the upper separator fin 156 is defined such that the top tapered portion 156a is spaced apart but is disposed proximate to the underside surface of the wafer 101 received on a carrier ring 134. The distance of separation between the top tapered portion 156a and the underside surface of the wafer 101 may be equal to a thickness of a bottom extension 134a of the carrier ring 134.

Figure 4E:
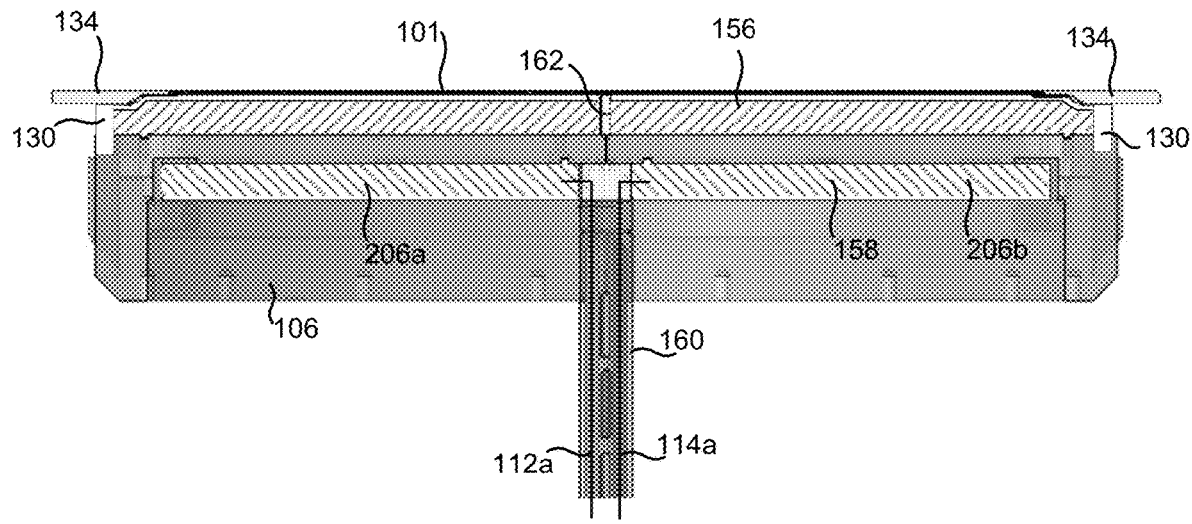
FIG. 4E illustrates a cross-sectional view along upper and lower separator fins defined in the showerhead pedestal, in accordance with one embodiment.

FIG. 4E illustrates a side cross-sectional view of a ShoPed used in a process chamber to deposit films on an underside surface of the wafer, in one embodiment. The cross-sectional view depicted in FIG. 4E is along a region where an upper separator fin and a lower separator fin are defined in the ShoPed 106. The lower separator fin 158 is disposed inside the ShoPed to define different zones. Each zone may be used to deposit films of different characteristics (e.g., composition, thickness, tensile or compressive property, etc.). Each zone defined by the inner separator fin 158 includes a corresponding inner plenum (206a, 206b) to receive a volume of a process gas from a process gas source (e.g., 112, 114) via a corresponding gas feed (e.g., 112a, 114a) to deposit a film. The gas feeds (112a, 114a) for supply the process gases to the different zones are housed within a central column 160 that supports the ShoPed 106.

The upper separator fin 156 is disposed along an outside, top surface of the ShoPed and is aligned with the inner separator fin 158. Similar to the inner separator fin 158 defining the different zones inside the ShoPed 106, the upper separator fin 156 is used to define boundaries for confining the process gases provided from the corresponding inner plenums within the respective regions defined between the underside surface of the wafer 101 and the top surface of the ShoPed 106, so that different films can be deposited in the respective regions. In the embodiment illustrated in FIG. 4E, a zonal separator line 162 is defined at the intersection of the upper separator fins 156 used to define the different zones. A carrier ring 134 with the wafer 101 is received on top of spacers 130 defined on the top surface of the ShoPed along the outer circumference region.

Figure 4F:
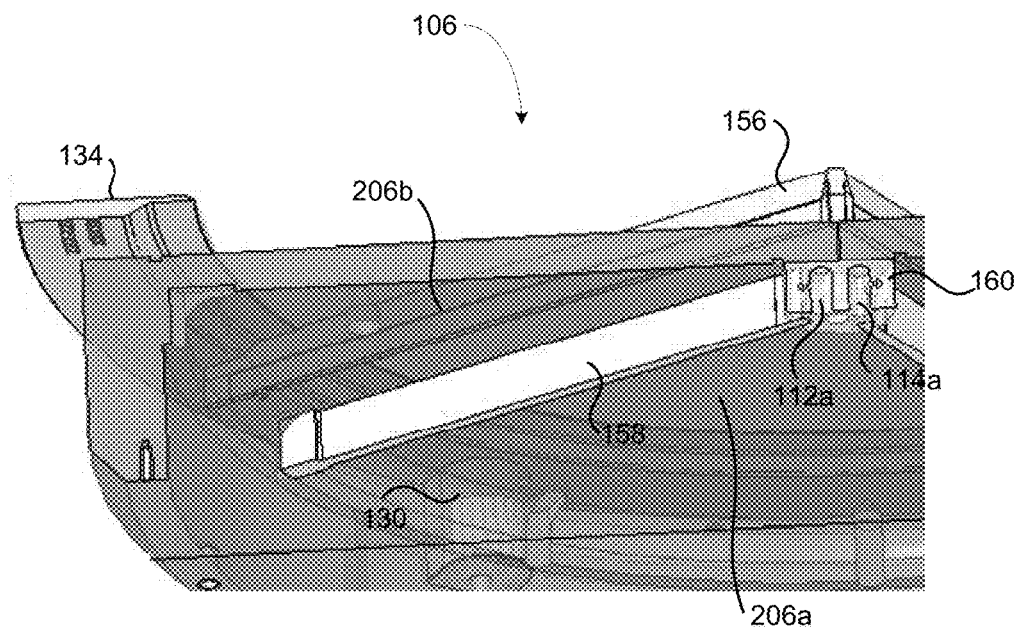
FIG. 4F illustrates a schematic view of an inside of the showerhead pedestal showing the location of the upper and the lower separator fins and the inner plenums defined by the lower separator fin, in accordance with one embodiment.

FIG. 4F illustrates a view of an inside of the ShoPed 106, in one embodiment. The inside of the ShoPed includes a first inner plenum 206a and a second inner plenum 206b defined by the lower separator fin 158. The carrier ring 134 may be received on top of spacers 130 or on the upper separator fin 156 or on both the spacers 130 and the upper separator fin 156. The spacers 130 and/or the upper separator fin 156 ensure that the underside surface of the wafer 101 is spaced apart from the top surface of the ShoPed by a distance that allows plasma to be generated in the gap defined between the wafer's underside surface and the ShoPed. The upper and lower separator fins 156, 158 define the boundaries for containing the plasma of the different gases so that different films may be formed in the different regions defined on the underside surface of the substrate.

Figures 2, 4G:
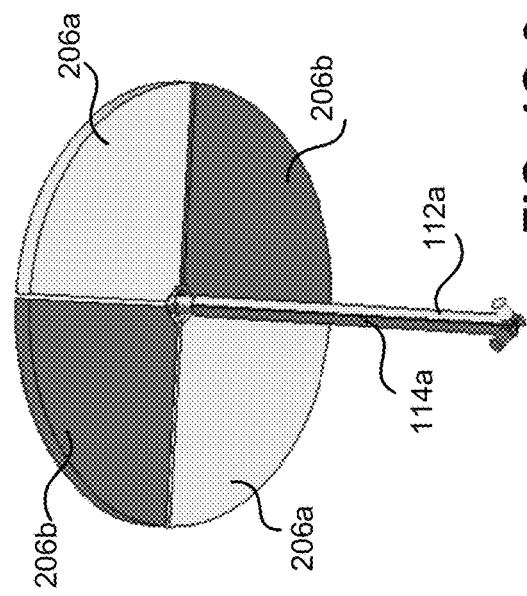
Figures 4, 4G:
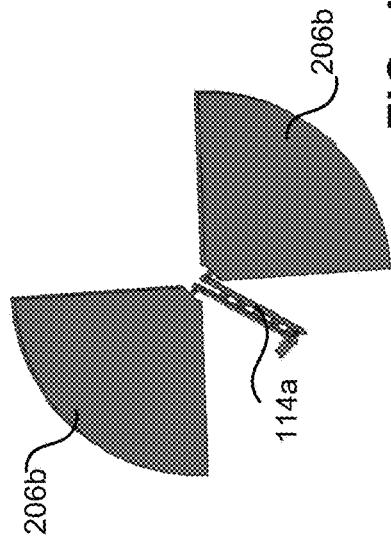
Figures 1, 4G:
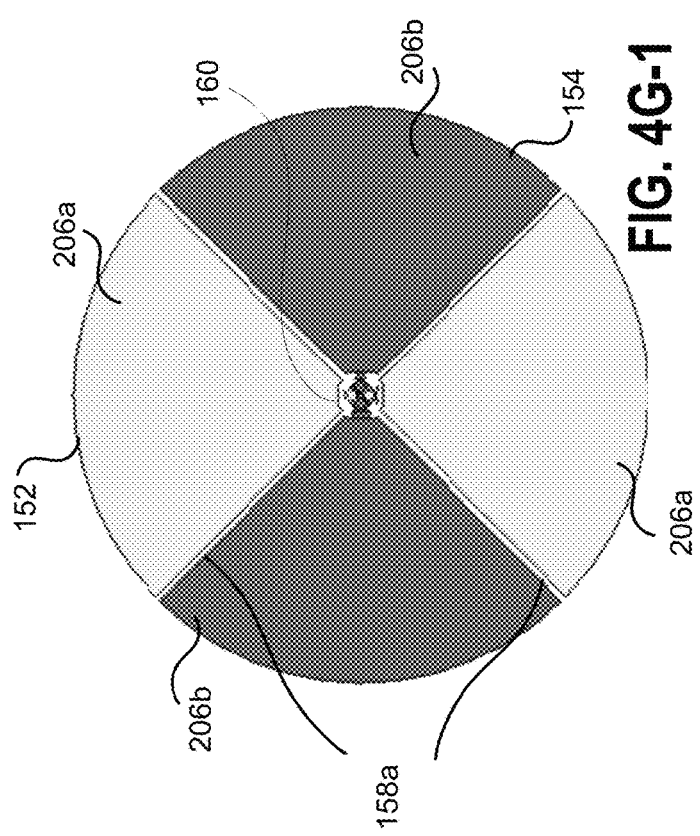
Figures 3, 4G:
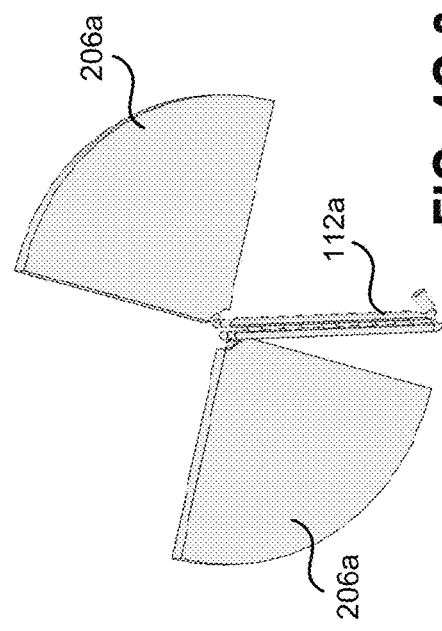

FIGS. 4G-1 through 4G-4 illustrate the volume of the different process gases in the different inner plenums defined by the zones of the ShoPed, in one embodiment. As shown in FIG. 4G-1, the inner plenums 206a and 206b are formed in zones 1 and 2, (152, 154) respectively, and are separated by fin boundary 158a defined by the inner separator fin 158.

A central column 160 includes the gas feeds to provide process gases to provide the volume of the respective gases in the respective inner plenums.

FIG. 4G-2 illustrates a view of the gas feeds that are connected to the corresponding inner plenums to provide the process gas from the corresponding process gas sources. For example, a first gas feed 112a is used to provide first process gas from a first process gas source 112 to the first inner plenum 206a and a second gas feed 114a is used to provide second process gas from a second process gas source 114 to the second inner plenum 206b. As shown, the inner plenums contain a volume of the respective process gases so that the process gases can be provided to generate the films for deposition. FIG. 4G-3 illustrates the first gas feed 112a to provide a volume of first process gas to the first inner plenum 206a and FIG. 4G-4 illustrates second gas feed 114a to provide a volume of second process gas to the second inner plenum 206b.

Figure 4H:
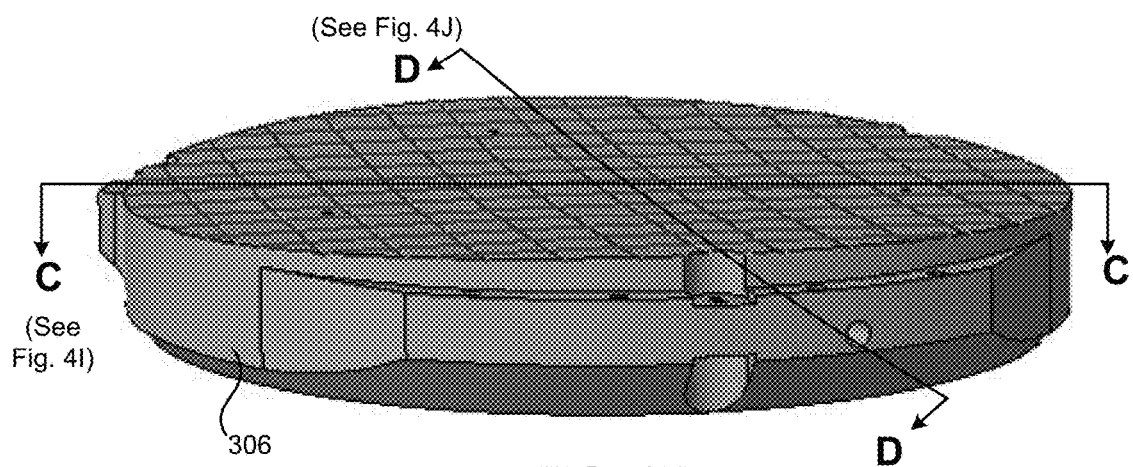
FIG. 4H illustrates a face shape of an alternate showerhead pedestal used in a chamber to perform selective deposition on an underside surface of a substrate, in accordance with one embodiment.
Figure 4I:
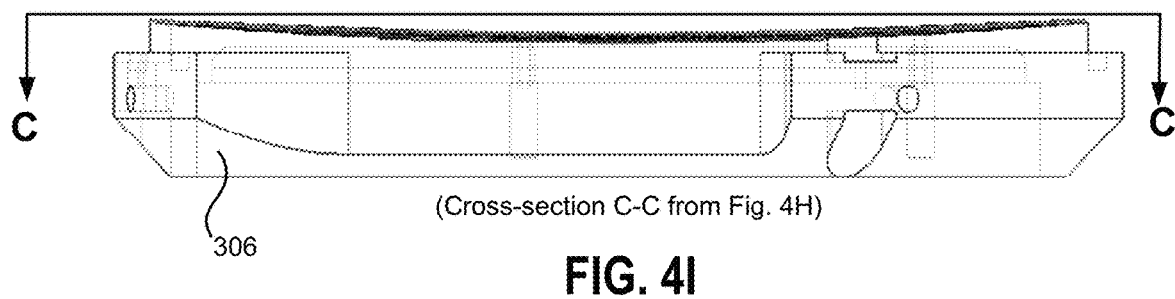
FIG. 4I illustrates a cross-sectional view of section C-C identified in FIG. 4H, in accordance with one embodiment.
Figure 4J:
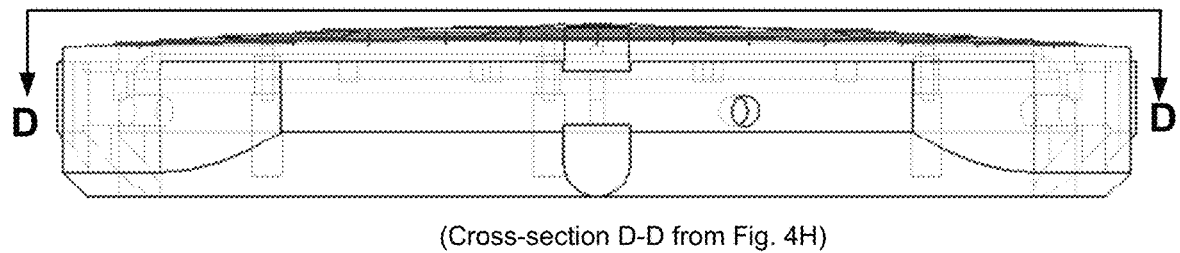
FIG. 4J illustrates a cross-sectional view of section D-D identified in FIG. 4H, in accordance with one embodiment.

FIGS. 4H to 4J illustrate the electrode face shape of an alternate ShoPed 306 that can be used to deposit different films in different regions on an underside surface of the wafer 101, in one implementation. The electrode face may be concave in shape as shown by cross-section C-C in FIG. 4H and also depicted in FIG. 4I, or convex in shape as shown by cross-section D-D in FIG. 4H and also depicted in FIG. 4J. In the embodiment illustrated in FIG. 4H, the face of the ShoPed 306 is a combination of both a concave shape along one direction and a convex shape along a different direction. The ShoPed's 306 face shape contour may be predetermined and used to tune or define the gaps between the ShoPed's face and the underside surface of the wafer, tune the process recipes for depositing the different films and to modulate plasma density across the different zones. The variation in the height of the face shape contour from a back side surface of the wafer 101 may be between about 1 mm at the highest point to about 15 mm at the lowest point identified in the face of the ShoPed 306, in one embodiment. In an alternate embodiment, the variation range may be between about 2 mm to about 10 mm. In another embodiment, the variation range may be between about 3 mm to about 7 mm. The zonal ShoPed of the embodiment illustrated in FIG. 4H or FIG. 1 may be used to determine flow modulation in the different zones. Additionally, the ShoPed enables depth uniformity of films deposited in the different zones using the same process gas or a different process gas.

It should be noted that selective deposition of films on the back side of the wafer to counteract the effect of the wafer bowing caused by films formed on the front side of the wafer, may be extended for front side deposition. For example, a film that is deposited as a hard mask layer in certain sections on the top side of the wafer may be a sacrificial film. This hard mask layer may be formed on top of other films. The underlying films may settle differently in different directions resulting in unevenness of the hard mask layer. When other films are being deposited on top of the hard mask layer, the effect of the differential settlement of these other underlying layers may have to be considered. The hard mask layer has been given just as an example and the deposition of other films to counteract the differential settlement of the underlying layers may be extended to any film that is being deposited over a surface (either front side or the back side) of the wafer. As a result, the features that enable selective deposition of films in different sections defined within the ShoPed 106 may be extended to the upper electrode so that uniformity of the deposition on the top surface may be realized. The face shape contour of the ShoPed illustrated in FIGS. 4H-4J may also be considered for the upper electrode at which time the selective deposition of the different films may take into consideration the facial contours as well as the differential features to define films over other films to counteract the settling effect of the underlying films.

Figure 4K:
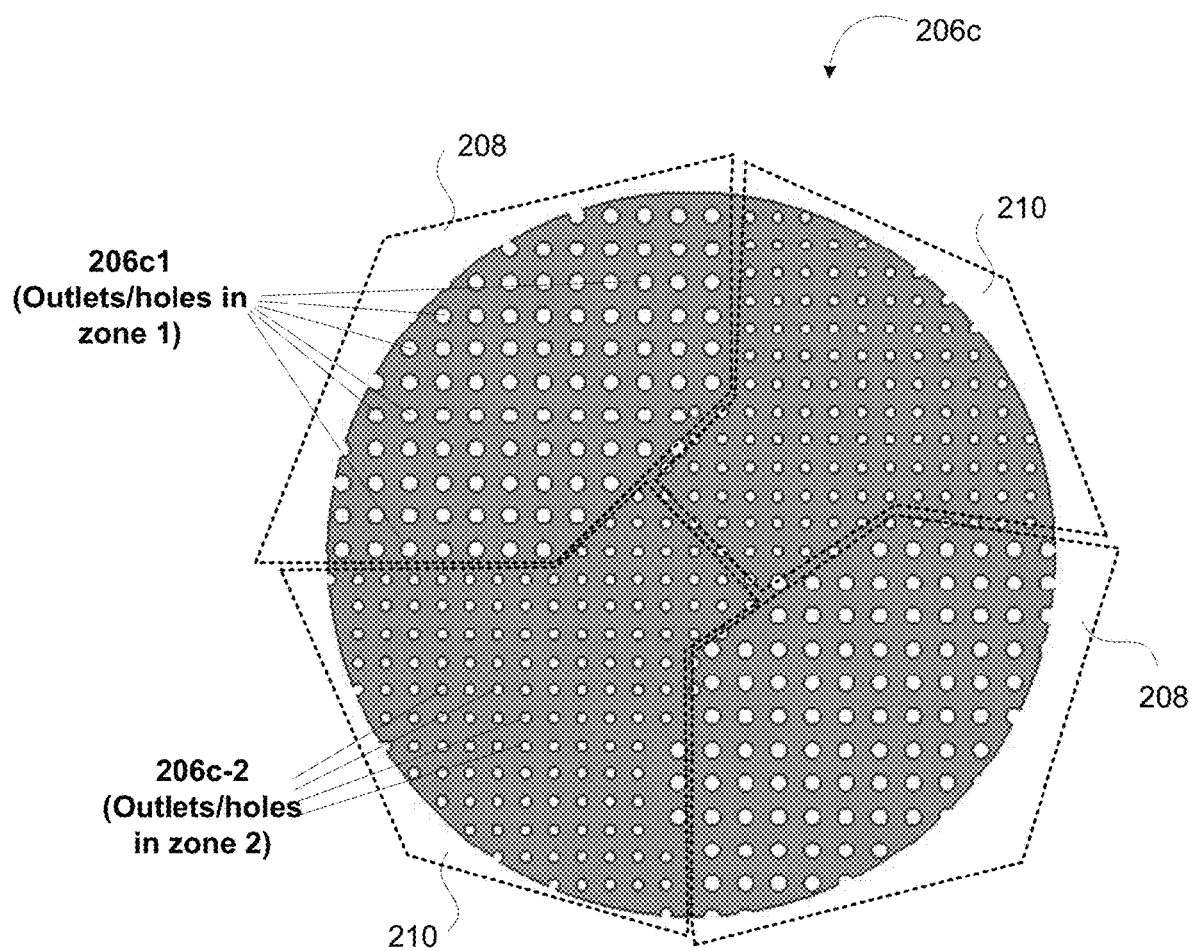
FIG. 4K illustrates an overhead view of a top surface of the showerhead pedestal with outlets having different outlet density and outlet size distributed along the top surface to increase hollow cathode discharge (HCD) in the different zones, in accordance with one embodiment.

FIG. 4K illustrates the density, distribution and size of the outlets (i.e., holes) 206c defined on a top surface of the ShoPed 106, in one embodiment. The outlet configuration 206c is provided as an example and should not be considered to be restrictive. The example ShoPed includes a first set of outlets 206c-1 defined in zone 1 to deposit film 1 and a second set of outlets 206c-2 in zone 2 to deposit film 2. The size of the outlets in the first set 206c-1 are larger and are confined to an area 208 while of the size of the outlets in the second set 206c-2 are smaller and are confined to an area 210. The size and the density of the outlets is to improve plasma density in certain sections over other sections. The larger size of the outlets encourage more hollow cathode discharges (HCDs) leading to denser plasma, depth rate of the films, etc. The location and distribution of the first and the second set of outlets may be defined based on the process recipes used in depositing the films, which are determined in accordance to a mathematical model, in one embodiment.

Gas sources 112, 114 are configured to provide one or more different types of gases to the ShoPed 106. By way of example, the gases can be reacting gases used for deposition onto the backside of the substrate 101, when the carrier ring 134 is supported by the supports 130 defined on the ShoPed 106, for instance. In one embodiment, a backside material layer can be deposited using the ShoPed 106 by flowing a process gas, such as a silane ($SiH_4$)+ammonia ($NH_3$). In this embodiment, the upper showerhead 104 may not be set up to deliver any reacting gas. Instead, the upper showerhead 104 may be set up to deliver an inert gas, such as nitrogen ($N_2$), to act as a purge gas. The chemistries for backside deposition process, the location, the thickness of the films are selected carefully to strategically counteract stresses caused by front side deposition of films and reduce or avoid wafer/substrate warping.

When top-side deposition is occurring in the process chamber, the ShoPed 106 is operated as a standard support chuck or pedestal, without flowing gases out of the outlets 206c-1 or 206c-2. Additionally, the carrier ring with the wafer may be lowered onto the top surface of the ShoPed 106 by moving the spacers out of the way, for example, where spacers are used to support the wafer, or by retracting the lift pins, in an alternate example that uses the lift pins to support the carrier ring with the wafer during back-side deposition. In this configuration, different types of process gases, depending on chosen recipe, can be introduced into the showerhead 104 and used to deposit over the top surface of the wafer 101. When the underside surface deposition is to occur, the ShoPed 106 acts as a showerhead. During backside or underside deposition, the carrier ring with the wafer is lifted up and supported either on the spacers or by lift pins or by other means (e.g., spider forks, etc.,) used in the ShoPed, and the process gases are introduced by way of the ShoPed 106. During this phase, the ShoPed 106 acts as a showerhead. The backside deposition is enabled to compensate for the stresses induced by the films defined in the top side deposition and assists in reducing wafer bow. As such, it should be appreciated that the ShoPed 106 can operate in multiple modes, depending on the surface being deposited, e.g., top surface or back surface of the substrate 128.

In one embodiment, the ShoPed 106 may include a heater, which is integrated therein to provide heating functions during top-side deposition. The heater elements can be distributed to provide even heating distribution, while still providing pass-through the set of outlets that deliver the gases during backside deposition.

Figure 5A:
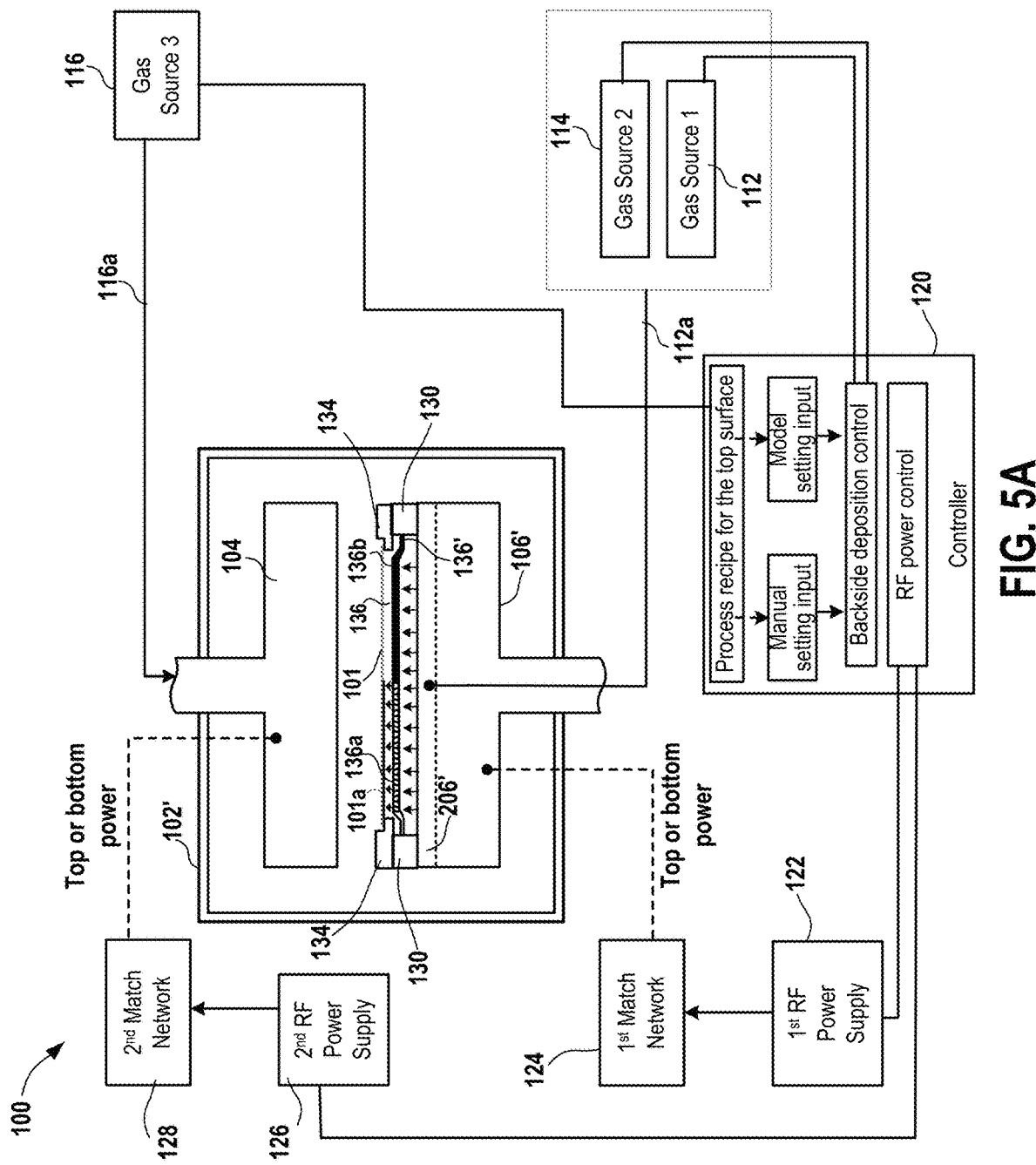
FIG. 5A illustrates a simplified schematic view of a plasma processing system having a lower electrode showerhead that includes a masking plate with different areas defined thereon for selective deposition of thin films in different portions on an underside surface of a wafer, in accordance with an alternate embodiment.

FIG. 5A illustrates an alternate embodiment in which the ShoPed is used to deposit different films on an underside surface of a wafer. The ShoPed 106' in this embodiment is different from the ShoPed described with reference to FIGS. 1 through 4K, in that the ShoPed 106' in this embodiment does not include the upper separator fin. The ShoPed 106' may include a lower separator fin to define an inner plenum. Alternately, the ShoPed 106' may include an inner plenum 206' defined to receive a process gas from any one of process gas sources 112, 114. The inner plenum 206' extends a width of the ShoPed and defines a volume for the process gas. Further, the inner plenum 206' interfaces with a set of outlets defined on a top surface of the ShoPed 106'. The set of outlets are used to provide the process gas from one of the process gas sources (112, 114) for depositing a film. In one embodiment, the inner plenum 206' may receive a first process gas from a first process gas source 112 to deposit a first film in a portion on the underside surface of the wafer 101 and after deposition of the first film, the first process gas may be purged out of the inner plenum 206' and a second process gas from a second process gas source 114 may be received into the inner plenum 206' for depositing a second film. The second film may be deposited over the first film or may be deposited in a different region.

Instead of the upper and the lower separator fins that were used to define the different zones on the ShoPed 106 illustrated in FIG. 1, the ShoPed 106' illustrated in FIG. 5A includes a masking plate 136. The masking plate 136 includes a first area 136a with openings to allow process gas to flow through and a second area 136b that is masked to prevent flow of any process gas. The masking plate 136 is received or integrated over the top surface of the ShoPed 106'. A design of the masking plate 136 allows a first gap to exist between the bottom surface of the masking plate 136 and the top surface of the ShoPed 106', when the masking plate is received on the top surface of the ShoPed 106'. In addition to the first gap, the design of the masking plate 136 allows a second gap to exist between the top surface of the masking plate 136 and the underside surface of the wafer 101, when the wafer 101 is received on a carrier ring 134. A size of the second gap is defined to allow the wafer to be spaced apart from the masking plate 136 yet close enough to allow the plasma generated from the process gas to be confined over the region defined on the underside surface of the wafer that is to receive the deposition. The size of the first gap is sufficient to generate a plasma from the process gas provided from the inner plenum 206'.

The masking plate 136 is received over the top surface of the ShoPed 106' such that the orientation of the masking plate 136 ensures that the first area 136a aligns with the region on the underside surface of the wafer 101 that is to receive the deposition of the film. Thus, during deposition of a film on the underside surface of the wafer 101, the process gas from the process gas source 1, for example, is received and equalized in the inner plenum 206' and then supplied to the first gap through the outlets. The first gap extends over the entire width of the ShoPed 106'. Plasma is generated within the gap using the process gas received therein. The generated plasma is directed over a first region on the underside surface of the wafer 101 through the openings provided in the first area 136a of the masking plate 136, as illustrated in FIG. 5A, so as to deposit a first film in the first region. The second area 136b is masked, thereby preventing the plasma from being applied to a second region on the underside surface of the wafer 101. The size of the second gap ensures that only the first region is exposed to the plasma. The first film may be deposited on the first region on the back side of the wafer 101 in a first station of a multi-station chamber or in the first process chamber, and after depositing the first film, the wafer with the carrier ring may be transferred to a second station within the same chamber or to a second chamber where a second film may be deposited over a second region on the back side of the wafer 101. The second station or the second chamber may be similarly configured to the first station or the first chamber except that the orientation of the masking plate 136 in the second station or second chamber is such that the first area 136a of the masking plate 136 is masked and the second area 136b of the masking plate 136 has openings in order to expose a second region on the back side of the wafer 101 to plasma for depositing a second film. The orientation of the masking plate 136 within the second chamber with the first area being masked and the second area with the openings is defined based on the wafer 101 maintaining its orientation as it is being transferred out of the first station or first chamber and moved into the second station or the second chamber. If the orientation of the wafer moving into the second chamber is different, then the orientation of the masking plate 136 in the second chamber is adjusted accordingly so that the second region on the back side of the wafer 101 receives the deposition of the second film.

FIGS. 5B-1 and 5B-2 show one example orientation of the masking plate in station 1 and station 2, in one embodiment. FIG. 5B-1 shows the masking plate 136 received over the ShoPed 106' in station 1 of a process chamber, for example. The station 1 may be part of a multi-station process chamber or may be part of a single-station process chamber. The masking plate 136 includes an edge 136' along the outer circumference, a first area 136a that includes the openings and a second area 136b that is masked. FIG. 5B-2 shows the masking plate 136 received over the ShoPed 106' in station 2. As can be seen, the first area 136a is masked or blocked and the second area 136b includes openings. The configurations of the masking plate in the two stations can be used to define different films in different regions on the back side of the wafer 101. To illustrate the relative location of the masked area in relation to the unmasked area on the masking plate in different stations, FIGS. 5B-1 and 5B-2 show a simple example of the masking plates 136 having the same orientation, although that might not be the case in reality. The location of the masked area and the unmasked area of the masking plate in each station may be defined based on the orientation of the wafer that is being introduced into the different stations.

Referring back to FIG. 5A, the masking plate is received on the top surface of the ShoPed 106' so that the top surface of the masking plate 136 is aligned with or is below a top surface of the spacers 130, in one embodiment where spacers 130 are used as support surface for the carrier ring 134. This is to allow the back side of the wafer 101 to be spaced apart from the masking plate 136, when the carrier ring 134 with the wafer 101 is received over the spacers 130. An edge 136' of the masking plate 136 is defined to have a profile so as to allow sufficient room for the carrier ring 134 to be received over the ShoPed 106'. The carrier ring 134 may be received on the spacers 130 and the edge profile of the masking plate 136 ensures that no part of the masking plate 136 comes in the way of the carrier ring received over the spacers 130. The profile of the edge 136' of the masking plate 136 may, for example, include a step-down region. A height of the step may be defined to ensure that enough gap exists between an inner edge of the carrier ring 134 and the top surface of the masking plate 136. The width of the step-down region may be equal to or greater than the bottom extension of the carrier ring 134. The dimension of the openings in the masking plate is designed to ensure a film of specific thickness, in one embodiment.

Figure 5C:
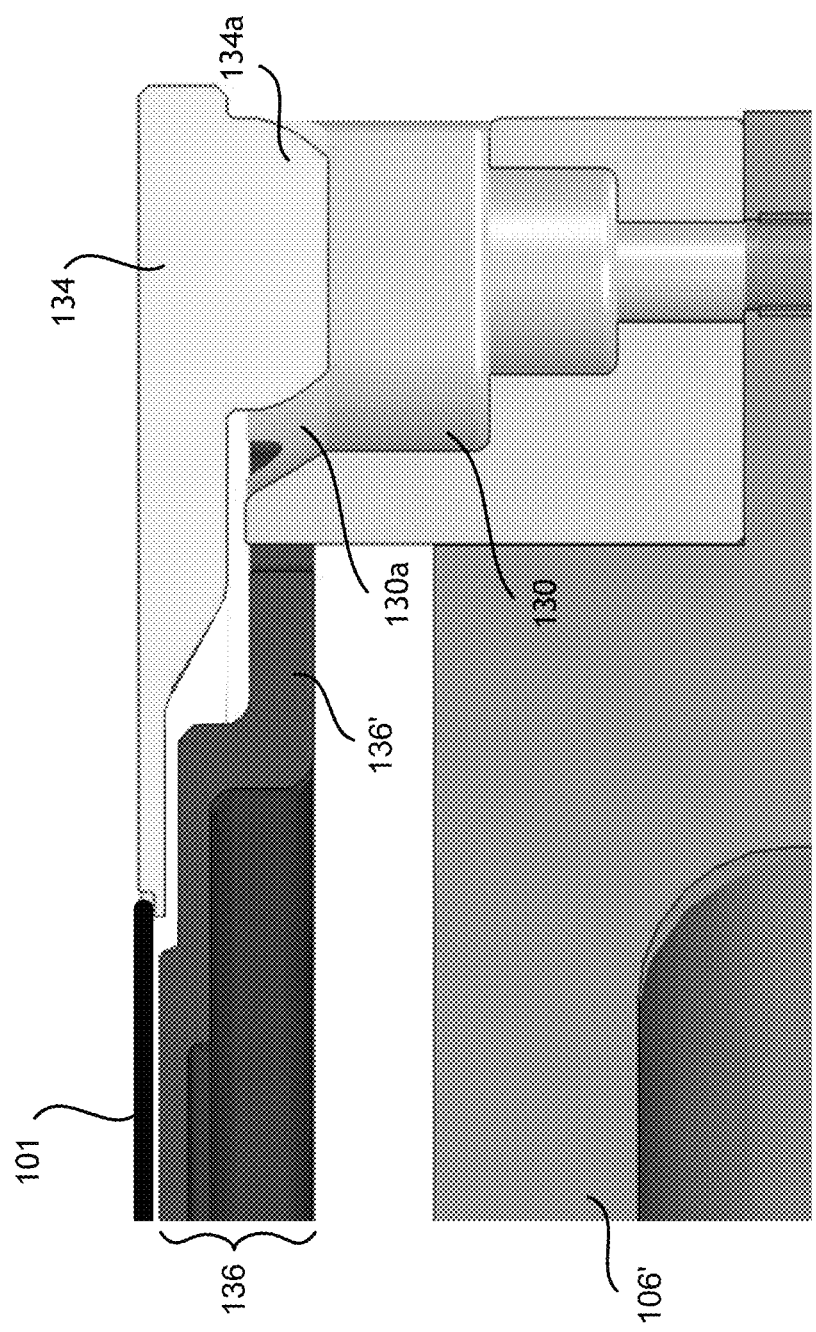
FIG. 5C illustrates an expanded view of an edge of the showerhead pedestal with a spacer that provides substrate support for receiving a carrier ring with a substrate, in accordance with one embodiment.

FIG. 5C illustrates an expanded view of the edge of the ShoPed 106' with the carrier ring 134 and the masking plate 136 received thereon, in one embodiment. The ShoPed 106' includes spacers 130 that are defined on the edge of the ShoPed 106'. These spacers 130 are distributed along the circumference of the edge of the ShoPed 106'. The spacer 130 includes a recess 130a to receive a ring extension 134a of the carrier ring 134 so as to provide a reliable support to the carrier ring and to ensure that the carrier ring does not get displaced, when received on the spacers. The edge region 136' of the masking plate 136 defined over the top surface of the ShoPed has a top profile that includes a step-down feature to allow the carrier ring 134 to be received on the spacer 130. The top profile of the edge region of the masking plate is shown to complement with the underside surface profile of the carrier ring 134 so as to not interfere with the supporting of the carrier ring on the spacer 130. The top profile of the edge region of the masking plate 136 is given as an example, and that other types of profiles may be envisioned for the edge region of the masking plate 136.

In another embodiment, the ShoPed may include zones defined on the inside of the ShoPed 106 using lower separator fin(s). The zones identify the different inner plenums for receiving volumes of different process gases. Different sets of outlets defined to interface with the inner plenums provide the corresponding process gases to different regions on the underside surface of the wafer to deposit different films. In this embodiment, the ShoPed does not include the upper separator fin. Instead, the ShoPed may include the masking plate integrated on the top surface of the ShoPed. Different areas are defined on the masking plate, with a first area being masked and a second area having openings to allow process gases supplied form an inner plenum through. The process gas is used to deposit a film. The integration of the masking plate to the top surface of the ShoPed is done so as to align each of the zones to a corresponding area on the masking plate. For example, a first zone of the ShoPed 106 may be aligned to a first area defined on the masking plate. Further, the areas in the masking plate are aligned so that the masked areas are aligned with regions that do not need deposition and the areas with the openings are aligned with regions on the underside surface of the wafer that is undergoing deposition. Each of the zones is connected to a process gas source through a corresponding gas feed so as to receive a volume of the process gas into the corresponding inner plenum. When a specific region of the underside surface of the wafer is to undergo deposition, the process gas from the corresponding process gas source is provided to the region through the openings in the masking plate while the other regions that are over the masked area of the masking plate do not receive any process gas. In this embodiment, the ShoPed allows selective operation of the different inner plenums by turning on the gas feed to the inner plenum corresponding to the first region so as to supply the process gas while the gas feeds to the remaining inner plenums are shut off. Additionally, the masked areas in the masking plate further ensure that the regions that are not supposed to receive deposition are spared from getting exposed to the process gas. This embodiment allows selective deposition of films in different regions on the back side of the wafer while preserving process gas resource as the process gas is provided only to the region that is over the openings of the area of the masking plate and not to the entire region under the masking plate.

The various embodiments allow use of a ShoPed for deposition in specific pre-defined areas on the back side of the wafer to compensate for the stress caused by the films deposited on the top side of the wafer, thereby preventing or substantially minimizing bowing that can affect the wafer yield. The masking plate or the masking feature defined in the ShoPed allows application of selective process gases to the back side of the wafer to perform selective deposition in certain regions. The masking plate allows for sequential deposition and makes use of different stations to perform the deposition over different regions while the zonal ShoPed allows for either sequential or simultaneous deposition in determined patterns. The geometry of the masking plate allows for modulating plasma impedance and flows during active deposition. Further, the geometry of the masking plate may take into consideration the shape contour (convex, concave, convex/concave) of the face of the ShoPed in defining the areas or zones on the masking plate. The distribution of the outlets along with the density and size of the outlets on the top surface of the ShoPed (shown in FIG. 4K) allows for plasma density modulation by enabling adjusting (either increasing or decreasing) hollow cathode discharge (HCD). The pattern shape may be determined with a mathematical model that uses the shape of one or more deformed wafer as input or through an equipment capable of in situ metrology and the pattern shape is used to define the zones. The combination of the various films and zones modulate the stress on the back side of the wafer to compensate for the wafer deformation caused by film deposition on the front side of the wafer. These and other advantages of the various embodiments can be easily envisioned by one skilled in the art.

Example material deposited on the back side of the wafer may include a dielectric material, in various embodiments. In some embodiments, the material deposited on the back side may be selected based on their tensile property, or compressive property, and such selection of the material may be to counteract the bowing resulting from layers of films deposited on the front side so as to improve quality of the devices and the yield results. In some cases, an oxide and/or nitride (e.g., silicon oxide/silicon nitride) may be used. Examples of silicon-containing reactants that may be used include, but are not limited to, silanes, halosilanes, and aminosilanes. A silane contains hydrogen and/or carbon groups, but does not contain a halogen. Examples of silanes are silane (SiH4), disilane (Si2H6), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane (SiCl4), trichlorosilane (HSiCl3), dichlorosilane (H2SiCl2), monochlorosilane (ClSiH3), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiary-butylamino)silane ($SiH_2(NHC(CH_3)_3)_2$ (BTBAS), tert-butyl silylcarbamate, $SiH(CH_3)-(N(CH_3)_2)_2$, $SiHCl—(N(CH_3)_2)_2$, $(Si(CH_3)_2NH)_3$ and the like. A further example of an aminosilane is trisilylamine ($N(SiH_3)$). Other potential silicon-containing reactants include tetraethyl orthosilicate (TEOS), and cyclic and non-cyclic TEOS variants such as tetramethoxysilane (TMOS), fluorotriethoxysilane (FTES), Trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(triehtoxysilyl)ethane (BTEOSE), bis(trimethoxysilyl)ethane (BTMOSE), dimethylethoxysilane (DMEOS), tetraethoxydimethyldisiloxane (TEODMDSO), tetrakis(trimehtylsiloxy)silane (TTMSOS), tetramethyldiethoxydisiloxane (TMDEODSO), triethoxysilane (TIEOS), trimethoxysilane (TIMEOS), or tetrapropoxysilane (TPOS).

Example nitrogen-containing reactants include, but are not limited to, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Examples of oxygen-containing co-reactants include oxygen, ozone, nitrous oxide, carbon monoxide, nitric oxide, nitrogen dioxide, sulfur oxide, sulfur dioxide, oxygen-containing hydrocarbons ($C_xH_yO_z$), water, mixtures thereof, etc.

The flow rate of these reactants will depend greatly on the type of reaction through which the back side layer is deposited. Where CVD/PECVD are used to deposit the back side layer, the flow rate of the silicon-containing reactant may be between about 0.5-10 mL/min (before atomization), for example between about 0.5-5 mL/min. The flow rate of a nitrogen-containing reactant, oxygen-containing reactant, or other co-reactant may be between about 3-25 SLM, for example between about 3-10 SLM.

The flow rates and power levels provided herein are examples and may be appropriate for processing on 300 mm wafers, unless otherwise specified. One of ordinary skill in the art would appreciate that these flows and power levels may be adjusted as necessary for wafers of other sizes. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

Figure 6:
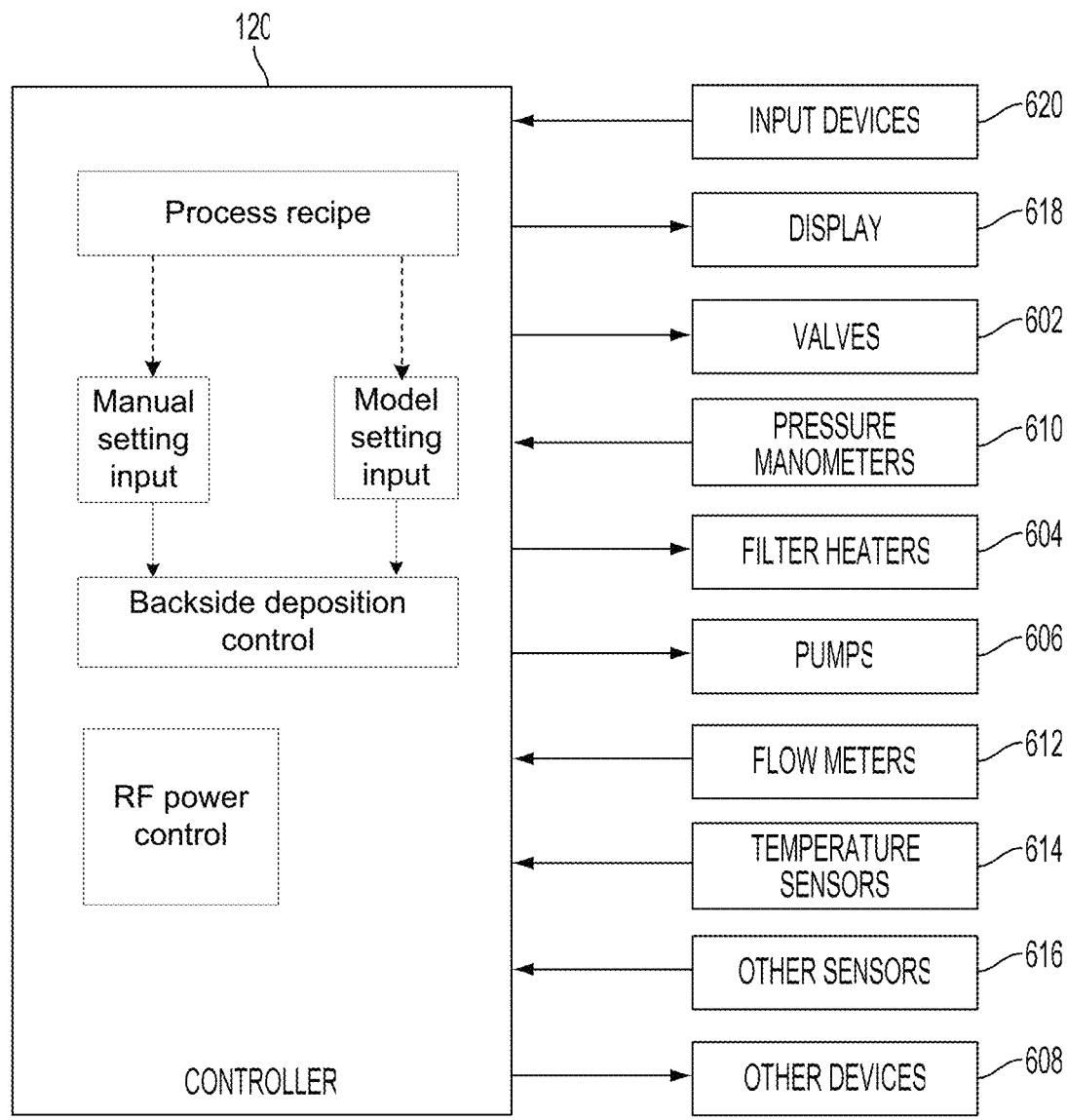
FIG. 6 shows a control module for controlling the systems, in accordance with one embodiment.

FIG. 6 shows a control module 120 for controlling the systems described above. For instance, the control module 120 may include a processor, memory and one or more interfaces. The control module 120 may be employed to control devices in the system based in part on sensed values. For example only, the control module 120 may control one or more of valves 602, filter heaters 604, pumps 606, and other devices 608 based on the sensed values and other control parameters. The control module 120 receives the sensed values from, for example only, pressure manometers 610, flow meters 612, temperature sensors 614, and/or other sensors 616. The control module 120 may also be employed to control process conditions during precursor delivery and deposition of the film. The control module 120 will typically include one or more memory devices and one or more processors.

The control module 120 may control activities of the precursor delivery system and deposition apparatus. The control module 120 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 120 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 120. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

It should be noted that any of the parts in the ShoPed described in the various embodiments are consumable parts and may be replaceable. As such, the parts, such as the ShoPed, the upper separator fin, the lower separator fin, the masking plate, the carrier ring, etc., may get damaged due to continuous exposure to the plasma. As a result, these parts may be manufactured separately and replaced individually or may be replaced as a single unit based on the amount of damage sustained. For example, the upper separator fin and the lower separator fin may be individually replaced within the ShoPed or alternately, the whole ShoPed may be replaced or portions of the ShoPed that includes the upper and the lower separator fins may be replaced as and when it is necessary so as to maintain the quality of the deposition carried out in the chamber.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. An apparatus for processing a wafer, the apparatus comprising:
a shower-pedestal;
a first plenum located within the shower-pedestal;
a second plenum located within the shower-pedestal;
one or more first gas feeds in fluidic communication with the first plenum within the shower-pedestal;
one or more second gas feeds in fluidic communication with the second plenum within the shower-pedestal;
a first set of outlets distributed across two first zones on a top surface of the shower-pedestal and in fluidic communication with the first plenum within the shower-pedestal;
a second set of outlets distributed across one or more second zones on the top surface of the shower-pedestal and in fluidic communication with the second plenum within the shower-pedestal; and
a wafer support mechanism configured to support a wafer over the shower-pedestal such that the wafer is elevated above the top surface of the shower-pedestal, wherein:
the top surface of the shower-pedestal faces a backside of the wafer,
the one or more second zones are interposed between the two first zones and separate the two first zones from one another, and
the two first zones are mirror images of each other about the one or more second zones.

2. The apparatus of claim 1, wherein the one or more first gas feeds are configured to provide a first set of one or more gases to the first plenum and the one or more second gas feeds are configured to provide a second set of one or more gases to the second plenum.

3. The apparatus of claim 2, wherein the first set of one or more gases and the second set of one or more gases include the same gas.

4. The apparatus of claim 3, wherein the shower-pedestal is configured to deliver process gases differentially with respect to the one or more first zones and the one or more second zones.

5. The apparatus of claim 1, wherein the shower-pedestal is configured to deliver process gases differentially with respect to the one or more first zones and the one or more second zones.

6. The apparatus of claim 1, wherein the wafer support mechanism includes a plurality of spacers that extend upward from the top surface of the shower-pedestal.

7. The apparatus of claim 6, wherein the spacers are configured to support a carrier ring that is configured to support the wafer above the top surface of the shower-pedestal.

8. The apparatus of claim 6, wherein the top surface of the shower-pedestal includes a carrier ring support region on an outer edge of the top surface of the shower-pedestal and the spacers are positioned within the carrier ring support region.

9. The apparatus of claim 8, wherein the spacers are configured to support a carrier ring that is configured to support the wafer above the top surface of the shower-pedestal.

10. The apparatus of claim 9, wherein each of the spacers has a recess that is located in a top surface of that spacer and that is configured to receive a corresponding ring extension on an underside of the carrier ring.

11. The apparatus of claim 1, wherein the first zones have bilateral symmetry across two orthogonal axes of symmetry.

12. The apparatus of claim 11, wherein the one or more second zones at least define a rectangular region that extends across at least a portion of the shower-pedestal and is centered on the top surface of the shower-pedestal.

13. The apparatus of claim 12, wherein:
the one or more second zones also at least define two end regions that each have an edge that is coextensive with a corresponding edge of the rectangular region,
the rectangular region is positioned between the end regions, and each end region expands in width with increasing distance from the rectangular region.

14. The apparatus of claim 2, wherein the first set of one or more gases is different from the second set of one or more gases.

15. The apparatus of claim 1, wherein the outlets in the first set of outlets are of a different size than the outlets in the second set of outlets.

16. The apparatus of claim 15, wherein the outlets in the first set of outlets are smaller than the outlets in the second set of outlets.

17. The apparatus of claim 1, further comprising at least one lower separator fin located within the shower-pedestal, the at least one lower separator fin defining a boundary between the first plenum and the second plenum.

18. The apparatus of claim 17, further comprising at least one upper separator fin, the at least one upper separator fin extending to a location above the top surface of the shower-pedestal and aligning with the at least one lower separator fin.

19. The apparatus of claim 1, further comprising a heater configured to heat the shower-pedestal.

20. The apparatus of claim 1, further comprising:
a processing chamber; and
a showerhead, wherein:
   the shower-pedestal is positioned within the processing chamber and beneath the showerhead, and
   the showerhead includes a third set of outlets distributed across a bottom surface of the showerhead and in fluidic communication with a plenum within the showerhead.

* * * * *